(12) United States Patent
Bell et al.

(10) Patent No.: US 8,490,412 B2
(45) Date of Patent: Jul. 23, 2013

(54) THERMOELECTRIC PERSONAL ENVIRONMENT APPLIANCE

(75) Inventors: Lon E. Bell, Altadena, CA (US); Robert W. Diller, Pasadena, CA (US); Darrell Park, South Pasadena, CA (US)

(73) Assignee: BSST, LLC, Irwindale, CA (US)

( * ) Notice: Subject to any disclaimer, the term of this patent is extended or adjusted under 35 U.S.C. 154(b) by 1356 days.

(21) Appl. No.: 12/135,062

(22) Filed: Jun. 6, 2008

(65) Prior Publication Data
US 2008/0307796 A1 Dec. 18, 2008

Related U.S. Application Data

(63) Continuation-in-part of application No. 10/215,163, filed on Aug. 7, 2002, now Pat. No. 7,426,835.

(60) Provisional application No. 60/310,565, filed on Aug. 7, 2001, provisional application No. 60/942,945, filed on Jun. 8, 2007.

(51) Int. Cl.
*F25B 21/02* (2006.01)

(52) U.S. Cl.
USPC .................................. 62/3.3; 62/259.3

(58) Field of Classification Search
USPC ............. 62/3.2, 3.3, 3.4, 3.6, 3.7, 259.3, 78, 62/515, 426
See application file for complete search history.

(56) References Cited

U.S. PATENT DOCUMENTS

| 2,944,404 A | 7/1960 | Fritts |
| 2,949,014 A | 8/1960 | Belton, Jr. et al. |
| 3,004,393 A | 10/1961 | Alsing |
| 3,006,979 A | 10/1961 | Rich |

(Continued)

FOREIGN PATENT DOCUMENTS

| CN | 1195090 | 10/1998 |
| DE | 1301454 B | 8/1969 |

(Continued)

OTHER PUBLICATIONS

Written Inquiry for Japanese Patent Application No. 2003-519322 mailed Jun. 10, 2009.

(Continued)

*Primary Examiner* — Mohammad M Ali
(74) *Attorney, Agent, or Firm* — Knobbe Martens Olson & Bear

(57) ABSTRACT

A personal environment appliance and a vent for a personal environment appliance are provided. The appliance includes at least one thermoelectric module over at least one inlet port. The appliance further includes at least one main outlet port spaced from the at least one inlet port and at least one waste outlet port spaced from the at least one inlet port. The appliance further includes at least one filter between the at least one inlet port and the at least one thermoelectric module. The vent includes a plurality of first tubular conduits generally parallel to one another and each first tubular conduit having a ratio of the length divided by the width, The vent further includes a plurality of second tubular conduits generally parallel to one another and having a ratio of the length divided by the width. The plurality of second tubular conduits generally surrounds the plurality of first tubular conduits. The ratios of the second tubular conduits are sufficiently large such that air flow from the second tubular conduits is substantially laminar.

30 Claims, 13 Drawing Sheets

U.S. PATENT DOCUMENTS

| | | |
|---|---|---|
| 3,071,495 A | 1/1963 | Hanlein |
| 3,129,116 A | 4/1964 | Corry |
| 3,178,895 A | 4/1965 | Mole et al. |
| 3,213,630 A | 10/1965 | Mole et al. |
| 3,252,504 A | 5/1966 | Newton |
| 3,527,621 A | 9/1970 | Newton |
| 3,607,444 A | 9/1971 | Debucs |
| 3,626,704 A | 12/1971 | Coe, Jr. |
| 3,635,037 A | 1/1972 | Hubert |
| 3,663,307 A | 5/1972 | Mole |
| 3,681,929 A | 8/1972 | Schering |
| 3,779,814 A | 12/1973 | Miles et al. |
| 3,817,043 A | 6/1974 | Zoleta |
| 4,038,831 A | 8/1977 | Gaudel et al. |
| 4,065,936 A | 1/1978 | Fenton |
| 4,281,516 A | 8/1981 | Berthet et al. |
| 4,297,841 A | 11/1981 | Cheng |
| 4,420,940 A | 12/1983 | Buffet |
| 4,494,380 A | 1/1985 | Cross |
| 4,499,329 A | 2/1985 | Benicourt et al. |
| 4,730,459 A | 3/1988 | Schlicklin et al. |
| 4,731,338 A | 3/1988 | Ralston et al. |
| 4,905,475 A * | 3/1990 | Tuomi .............. 62/3.3 |
| 4,989,626 A | 2/1991 | Takage et al. |
| 5,038,569 A | 8/1991 | Shirota et al. |
| 5,092,129 A | 3/1992 | Bayes et al. |
| 5,097,829 A | 3/1992 | Quisenberry |
| 5,119,640 A * | 6/1992 | Conrad .............. 62/272 |
| 5,193,347 A | 3/1993 | Aprisdorf |
| 5,228,923 A | 7/1993 | Hed |
| 5,232,516 A | 8/1993 | Hed |
| 5,303,771 A * | 4/1994 | Des Champs .......... 165/165 |
| 5,385,020 A | 1/1995 | Gwilliam et al. |
| 5,386,823 A * | 2/1995 | Chen .............. 128/204.15 |
| 5,429,680 A | 7/1995 | Fuschetti |
| 5,499,504 A | 3/1996 | Mill et al. |
| 5,584,183 A | 12/1996 | Wright et al. |
| 5,592,363 A | 1/1997 | Atarashi et al. |
| 5,605,047 A | 2/1997 | Park et al. |
| 5,682,748 A | 11/1997 | De Viilbiss et al. |
| 5,802,856 A | 9/1998 | Schaper et al. |
| 5,860,472 A | 1/1999 | Batchelder |
| 5,867,990 A | 2/1999 | Ghoshal |
| 5,900,071 A | 5/1999 | Harman |
| RE36,242 E | 6/1999 | Apisdorf |
| 5,921,088 A | 7/1999 | Imaisumi et al. |
| 5,966,941 A | 10/1999 | Ghoshal |
| 5,987,890 A | 11/1999 | Chiu et al. |
| 6,000,225 A | 12/1999 | Ghoshal |
| 6,082,445 A | 7/2000 | Dugan |
| 6,084,172 A | 7/2000 | Kishi et al. |
| 6,096,966 A | 8/2000 | Nishimoto et al. |
| 6,282,907 B1 | 9/2001 | Ghoshal |
| 6,319,744 B1 | 11/2001 | Hoon et al. |
| 6,334,311 B1 | 1/2002 | Kim et al. |
| 6,346,668 B1 | 2/2002 | McGrew |
| 6,347,521 B1 | 2/2002 | Kadotani et al. |
| 6,366,832 B2 | 4/2002 | Lomonaco et al. |
| 6,367,261 B1 | 4/2002 | Marshall et al. |
| 6,401,462 B1 | 6/2002 | Bielinski |
| 6,412,287 B1 | 7/2002 | Hughes et al. |
| 6,438,964 B1 * | 8/2002 | Giblin .............. 62/3.5 |
| 6,446,442 B1 | 9/2002 | Bathelor et al. |
| 6,477,844 B2 | 11/2002 | Ohkubo et al. |
| 6,481,213 B2 | 11/2002 | Carr et al. |
| 6,510,696 B2 | 1/2003 | Guttman et al. |
| 6,530,231 B1 | 3/2003 | Nagy et al. |
| 6,530,842 B1 | 3/2003 | Wells et al. |
| 6,539,725 B2 | 4/2003 | Bell |
| 6,560,968 B2 | 5/2003 | Ko |
| RE38,128 E | 6/2003 | Gallup et al. |
| 6,598,405 B2 | 7/2003 | Bell |
| 6,625,990 B2 | 9/2003 | Bell |
| 6,637,210 B2 | 10/2003 | Bell |
| 6,672,076 B2 | 1/2004 | Bell |
| 6,812,395 B2 | 11/2004 | Bell |
| 6,948,321 B2 | 9/2005 | Bell |
| 6,959,555 B2 | 11/2005 | Bell |
| 7,111,465 B2 | 9/2006 | Bell |
| 7,231,772 B2 | 6/2007 | Bell |
| 7,273,981 B2 | 9/2007 | Bell |
| 7,421,845 B2 | 9/2008 | Bell |
| 7,426,835 B2 | 9/2008 | Bell et al. |
| 2001/0005990 A1 | 7/2001 | Kim |
| 2002/0014261 A1 | 2/2002 | Caillat et al. |
| 2003/0094265 A1 | 5/2003 | Chu et al. |
| 2004/0261829 A1 | 12/2004 | Bell |
| 2005/0263177 A1 | 12/2005 | Bell |
| 2008/0035195 A1 | 2/2008 | Bell |
| 2008/0173342 A1 | 7/2008 | Bell et al. |
| 2008/0245398 A1 | 10/2008 | Bell et al. |
| 2008/0289677 A1 | 11/2008 | Bell et al. |

FOREIGN PATENT DOCUMENTS

| | | |
|---|---|---|
| GB | 2027534 A | 2/1980 |
| GB | 2267338 | 12/1993 |
| JP | 56-18231 A | 2/1981 |
| JP | 01-200122 | 8/1989 |
| JP | 03-102219 | 10/1991 |
| JP | 04-165234 | 6/1992 |
| JP | 05-219765 A | 8/1993 |
| JP | 07-54189 | 6/1995 |
| JP | 07-253224 | 10/1995 |
| JP | 2000-185542 | 7/2000 |
| JP | 2002-13758 | 1/2002 |
| SE | 329870 | 5/1969 |
| SE | 337227 | 8/1971 |
| WO | WO 03/014634 | 2/2003 |

OTHER PUBLICATIONS

Angrist, Stanley W., *Direct Energy Conversion*, 32 Ed. Ally & Bacon (1976). (In 3 Parts).

Bell, L. E., "Increased Thermoelectric System Thermodynamic Efficiency by Use of Convective Heat Transport," Proc. 21st Int'l Conf. on Thermoelectric, Long Beach, CA (Aug. 2002).

Bell, L. E., "Use of Thermal Isolation to Improve Thermoelectric System Operating Efficiency," Proc. 21st Int'l conf. on Thermoelectric, Long Beach, CA (Aug. 2002).

Buist, R. J. et al., "A New Concept for Improving Thermoelectric Heat Pump Efficiency," pp. 60-63, Borg-Warner Thermoelectric Wolf and Algonquin Road, 1976.

Buist, R. et al., "Theoretical Analysis of Thermoelectric Cooling Performance Enhancement Via Thermal and Electrical Pulsing," Journal of Thermoelectricity, No. 4, 1996.

*CRC Handbook of Thermoelectric*, ed. D.M. Rowe, Chapter 54, *Medium-Scale Cooling: Thermoelectric Module Technology*, Jul. 1995, ISBN: 0-8493-0146-7.

Goldsmid, H. J., *Electronic Refrigeration*, Pion Ltd., 207 Brondesbury Park, London (1986).

Ikoma, K., et al., "Thermoelectric Module and Generator for Gasoline Engine Vehicles," 17th Int'l conf. on Thermoelectric, Nagoya, Japan, pp. 464-467 (1998).

Miner, A., et al., "Thermo-Electro-Mechanical Refrigeration Based on Transient Thermoelectric Effects," Applied Physics Letters, vol. 75, pp. 1176-1178 (1999).

Tada, Shigeru, et al., "A New Concept of Porous Thermoelectric Module Using a Reciprocating Flow for Cooling/Heating System (Numerical Analysis for Heating System)," 16th International Conference on Thermoelectric (1997).

International Search Report for PCT/US02/25233 dated Sep. 24, 2002.

* cited by examiner

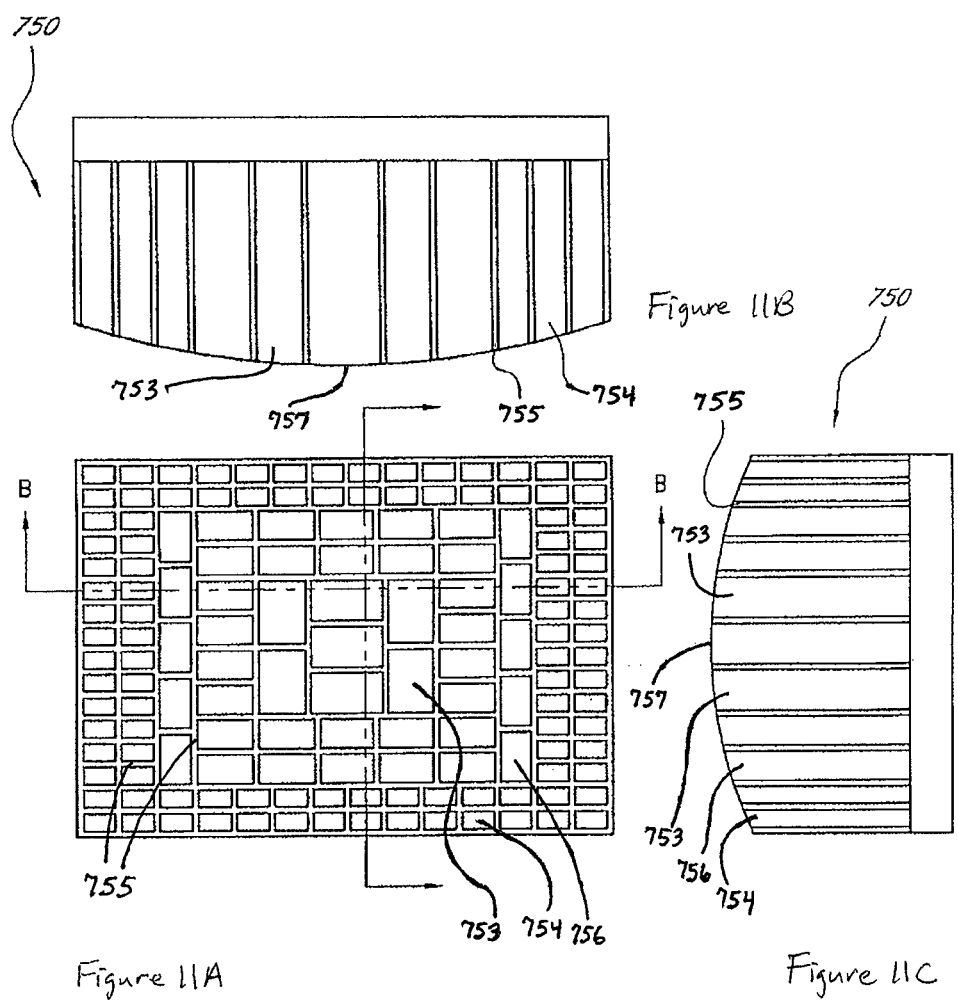

THERMOELECTRIC PERSONAL ENVIRONMENT APPLIANCE

CLAIM OF PRIORITY

The present application is a continuation-in-part of U.S. patent application Ser. No. 10/215,163, filed Aug. 7, 2002 now U.S. Pat. No. 7,426,835, which is incorporated in its entirety by reference herein and which claims the benefit of priority to U.S. Provisional Patent Application No. 60/310, 565, filed Aug. 7, 2001, which is incorporated in its entirety by reference herein. The present application claims the benefit of priority to U.S. Provisional Patent Application No. 60/942,945, filed Jun. 8, 2007, which is incorporated in its entirety by reference herein.

BACKGROUND

1. Field of the Invention

The present application relates generally to conditioning of air by heating and/or cooling the air and, more particularly, is concerned with providing individualized, localized thermal comfort.

2. Description of the Related Art

Generally, where work places or dwellings are climate controlled, the climate control is provided by large compressor-based systems to large zones encompassing many individual areas. This situation results in high costs of conditioning areas that are not occupied and also forces areas within a single controlled zone to accept that climate output whether or not it satisfies an individual's preference or sense of comfort. Further, such control over large zones is not uniform, so that some individuals present in the zone are exposed to areas that are too hot while others are too cold.

Compressor-based systems for individualized climate control are impractical because of their size, cost, and noise output. Others have addressed the need for individualized climate control using thermoelectric devices. For example, U.S. Pat. No. 5,193,347 discloses a helmet with a thermoelectric cooler supplying a cool breeze to the face of the wearer. Such systems are not suitable for most practical work or dwelling situations. Another example is the system described in U.S. Pat. No. 4,905,475. In its description, the patent presents a system with airflow directed to the head and neck of the individual, and with only rudimentary control over the air temperature produced. Many workers, particularly those with sedentary jobs, have a need for more individualized climate control using an appliance not so intimately and closely coupled to their person, but more closely coupled to than are large compressor-based systems or central heating systems.

SUMMARY

In certain embodiments, a personal environment appliance comprises at least one inlet port. The appliance further comprises at least one thermoelectric module comprising a main flow conduit and a waste flow conduit. The at least one thermoelectric module is over the at least one inlet port. The appliance further comprises at least one main outlet port spaced from the at least one inlet port and in fluidic communication with the main flow conduit. The appliance further comprises at least one waste outlet port spaced from the at least one inlet port and in fluidic communication with the waste flow conduit. The appliance further comprises at least one filter between the at least one inlet port and the at least one thermoelectric module. The appliance further comprises at least one fan configured to drive a first air flow from the at least one inlet port, through the at least one filter, through the main flow conduit, and through the at least one main outlet port. The at least one fan is further configured to drive a second air flow from the at least one inlet port, through the waste flow conduit, and through the at least one waste outlet port.

In certain embodiments, a vent for a personal environment appliance comprises an inlet portion and an outlet portion. The vent further comprises a plurality of first tubular conduits generally parallel to one another and extending from the inlet portion to the outlet portion in a first direction. Each first tubular conduit has a length in the first direction, a width in a second direction generally perpendicular to the first direction, and a ratio of the length divided by the width. The vent further comprises a plurality of second tubular conduits generally parallel to one another and extending from the inlet portion to the outlet portion in the first direction. Each second tubular conduit has a length in the first direction, a width in the second direction, and a ratio of the length divided by the width. The plurality of second tubular conduits generally surrounds the plurality of first tubular conduits. The ratios of the second tubular conduits are sufficiently large such that air flow from the second tubular conduits is substantially laminar.

In certain embodiments, a method adjusts the personal environment of a user. The method comprises providing an appliance comprising at least one inlet port. The appliance further comprises at least one thermoelectric module comprising a main flow conduit and a waste flow conduit. The at least one thermoelectric module is over the at least one inlet port. The appliance further comprises at least one main outlet port spaced from the at least one inlet port and in fluidic communication with the main flow conduit. The appliance further comprises at least one waste outlet port spaced from the at least one inlet port and in fluidic communication with the waste flow conduit. The appliance further comprises at least one filter between the at least one inlet port and the at least one thermoelectric module. The method further comprises driving a first air flow from the at least one inlet port, through the at least one filter, through the main flow conduit, and through the at least one main outlet port. The method further comprises driving a second air flow from the at least one inlet port, through the waste flow conduit, and through the at least one waste outlet port.

In certain embodiments, a method adjusts the personal environment of a user. The method comprises providing an appliance comprising an outlet vent configured to output conditioned air. The vent comprises a plurality of first tubular conduits generally parallel to one another. Each first tubular conduit has a length generally along the first tubular conduit, a width in a direction generally perpendicular to the first tubular conduit, and a ratio of the length divided by the width. The vent further comprises a plurality of second tubular conduits generally parallel to one another. Each second tubular conduit has a length generally along the second tubular conduit, a width in a direction generally perpendicular to the second tubular conduit, and a ratio of the length divided by the width. The plurality of second tubular conduits generally surrounds the plurality of first tubular conduits. The ratios of the first tubular conduits are less than the ratios of the second tubular conduits. The method further comprises outputting conditioned air from the outlet vent. Air flowing from the second tubular conduits is substantially laminar.

BRIEF DESCRIPTION OF THE DRAWINGS

FIG. 11A schematically illustrates an example outlet vent compatible with certain embodiments described herein having a generally rectangular register.

FIG. 11B schematically illustrates a cross-sectional view of the outlet vent of FIG. 11A along the dashed line B-B.

FIG. 11C schematically illustrates a cross-sectional view of the outlet vent of FIG. 11A along the dashed line C-C.

DETAILED DESCRIPTION

Figure 1:
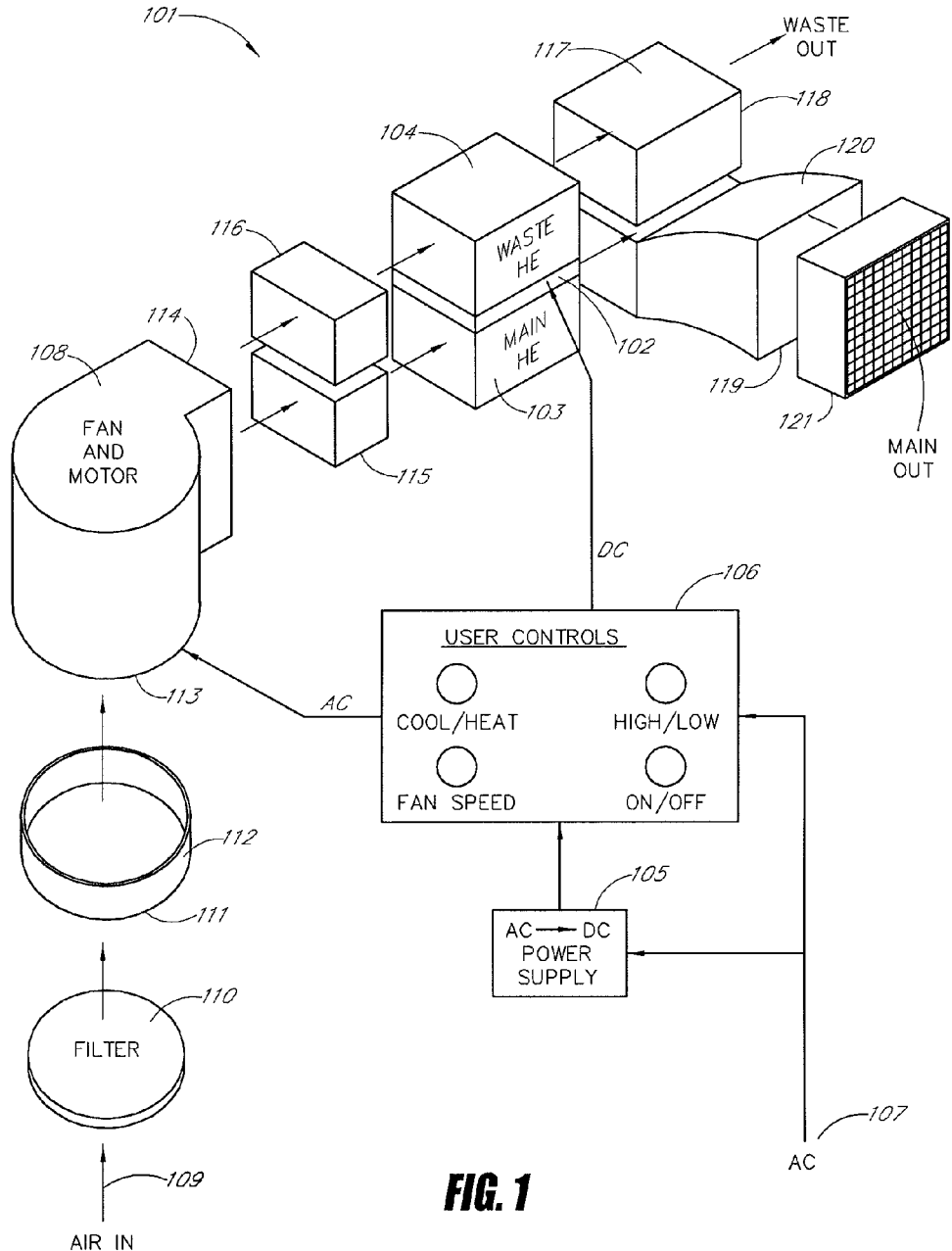
FIG. 1 schematically illustrates an example thermoelectric personal environment appliance in accordance with certain embodiments described herein.

Certain embodiments described herein advantageously provide localized personal comfort to individuals with a range of controllability built into a device that is not intrusive to them or obstructive to their normal work or other environment. In certain embodiments, localized control for the temperature in the proximate vicinity of one or more individuals is provided. Such embodiments are distinguished from mobile cooling systems, such as individually cooled and heated seats, which more directly cool or heat the seat occupant as opposed to the local environment. In certain embodiments, the local workspace environment is controllable.

Certain embodiments described herein advantageously augment a personal environment appliance with additional features useful to an individual and synergistic with its fundamental design. Such features include localized air filtration, small area lighting, beverage heating/cooling, small personal refrigerator, and calming auditory environment.

Certain embodiments described herein are generally intended for non-mobile applications, but could be implemented in a mobile environment or workspace or work area setting.

Certain embodiments described herein provide a personal environment appliance that provides heating and/or cooling in a localized area, such as a work area. The appliance generally has at least one electric motor driving at least one fan, at least one inlet air path to a low pressure side of the at least one fan, at least one thermoelectric device, at least one main side heat exchanger in thermal communication with the at least one thermoelectric device, wherein inlet air passes the heat exchanger and changes temperature, and at least one outlet for air that has passed the heat exchanger to provide temperature control of the local area.

In certain embodiments, at least one insulative insert is enclosed within a housing and is shaped to provide at least one air pathway. For example, the at least one insulative insert is shaped to form the at least one inlet air path.

In certain embodiments, an air filter is provided, preferably demountably so it can be replaced. In certain embodiments, at least one flow directing device is provided for the outlet. In certain embodiments, at least one AC to DC power supply is provided to supply electricity to the at least one thermoelectric device.

In certain embodiments, a user operable control is provided. The user operable control advantageously adjusts the air flow rate, and/or the amount of heating or cooling, and/or selects cooling, heating, operation of the fan without heating or cooling, and off.

The appliance may be constructed to rest on a surface, to be suspended from a surface, or to be attached to a surface. In certain embodiments, the appliance is configured to mount on a computer monitor. In certain such embodiments, an anti-glare screen may be provided. In certain embodiments, a light is included, such as a work surface light. In certain other embodiments, a sound generator is provided. The sound generator may generate white noise or other distraction-reducing sounds, and may also provide active noise cancellation. In certain embodiments, the appliance includes a thermoelectric beverage cooler and heater. A holder for desk implements and supplies may also be a part of the appliance. In certain other embodiments, a thermoelectric refrigerator may be built into the appliance.

For improved efficiency, certain embodiments employ thermal isolation of at least some of the at least one thermoelectric devices in the direction of flow.

As used herein, the term "thermoelectric module" or "TE module" are used in the broad sense of their ordinary and accustomed meaning to persons skilled in the art, including but not limited to, (1) conventional thermoelectric modules, such as those produced by Marlow Industries of Dallas, Tex., (2) quantum tunneling converters (3) thermoionic modules, (4) magneto caloric modules, (5) elements utilizing one, or any by combination of, thermoelectric, magneto caloric, quantum, tunneling and thermoionic effects, and (6) any combination, array, assembly and other structure of (1) through (5) above.

As used herein, the words "cold," "hot," "cooler," "hotter" and the like are relative terms, and do not signify a particular temperature or temperature range. In addition, the embodiments described herein are merely examples, and are not restrictive to the invention, which is broader than any of the individual embodiments disclosed herein.

With appropriate technology, providing individual localized area climate control requires a small power input to achieve easily discernible effects on the individual. Zonal climate control temperatures may be adjusted to reduce the power required for overall space climate control and individual localized area climate control appliances may be used to fine-tune the environment for each individual. Overall, such systems can save energy. Certain embodiments described herein advantageously utilize thermoelectric devices that are small, quiet, and can be quite efficient when employed properly.

Individualized climate control also can increase productivity, not only because the individuals can choose the temperature most comfortable to them, but because they are empowered to make the choice.

FIG. 1 is a schematic diagram of an example personal environment appliance 101 in accordance with certain embodiments described herein. A thermoelectric module 102 is in good thermal communication with a main side heat exchanger 103 and a waste side heat exchanger 104. The good thermal communication is achieved, for example, using thermal grease or a thermally conductive epoxy. As shown, the heat exchangers 103 and 104 are straight finned heat exchangers although many other types of heat exchangers may be used. DC power is supplied to the TE module 102 by the power supply 105 as selected by the settings (on/off, cool/heat, and high/low) of the user controls 106. The power supply 105 of certain embodiments is a switching power supply to maximize efficiency and minimize cost and weight. The power supply 105 may be either internal to the appliance or may be external with suitable electrical cabling connecting the power supply 105 with the user controls 106. The input to the power supply can be AC power 107 delivered through a suitable cord and plug (not shown). AC power 107 can also be provided though the user controls 106 (on/off and fan speed) to an electric motor driven fan 108. Other sources of power are also acceptable. As shown, the electric motor driven fan of certain embodiments has a single motor and a single fan blade. Depending upon the amount of air flow required and the pressure differential that must be produced, multiple fan blades can be mounted on the shaft or multiple shaft motors can be used. Alternately, two completely separate fan blade and motor assemblies can be used. Although a DC fan could also be used, the fan motor of certain embodiments is a two- or three-speed AC motor to minimize the capacity needed from the DC power supply 105. A DC fan could also be used.

The fan 108 pulls fresh air 109 through a filter 110 (preferably replaceable) located at the fresh air inlet port 111 and through a duct 112 to the low-pressure side 113 of the fan 108. Air exits the high pressure side 114 of the fan 108 and passes through both the main side air input duct 115 and the waste side input duct 116 which are connected to the main side heat exchanger 103 and the waste side heat exchanger 104 respectively. Advantageously, to maximize the performance of the appliance and the comfort to the user, the air flow through the main side can be approximately 5 to 10 CFM while that on the waste side can be somewhat more, for example, from 1.5 to 3 times the main flow. The air flow from the waste side heat exchanger 104 passes through the waste side output duct 117, exiting the appliance at the waste outlet port 118, which in certain embodiments, points away from both the fresh air port 111 and the main outlet port 119. The waste may also be vented outside, to another room, or into a crawl or attic space, or the like. The airflow from the main side heat exchanger 103 passes through the main side output duct 120 and through a flow-directing device 121 such as one with adjustable louvers or one with fixed vanes within a ball directionally adjustable in socket, as examples.

As air passes through the main side heat exchanger 103, its temperature is changed from that of the air entering by the amount and in the direction as selected by the user controls 106. As air passes through the waste side heat exchanger 104, its temperature is changed in the opposite direction. Thus, the temperature of the air exiting the main side is cooler if the user has selected cooling mode, and warmer if the heating mode is selected with the amount of temperature differential determined by the user's selection of high or low. As shown, the adjustment of the amount of temperature change in certain embodiments has only two discrete levels. Any number of discrete levels may be used in certain other embodiments, and in certain other embodiments, the adjustment may be continuous. This control may also be combined with the on/off switch into a physically single control.

Figure 8:
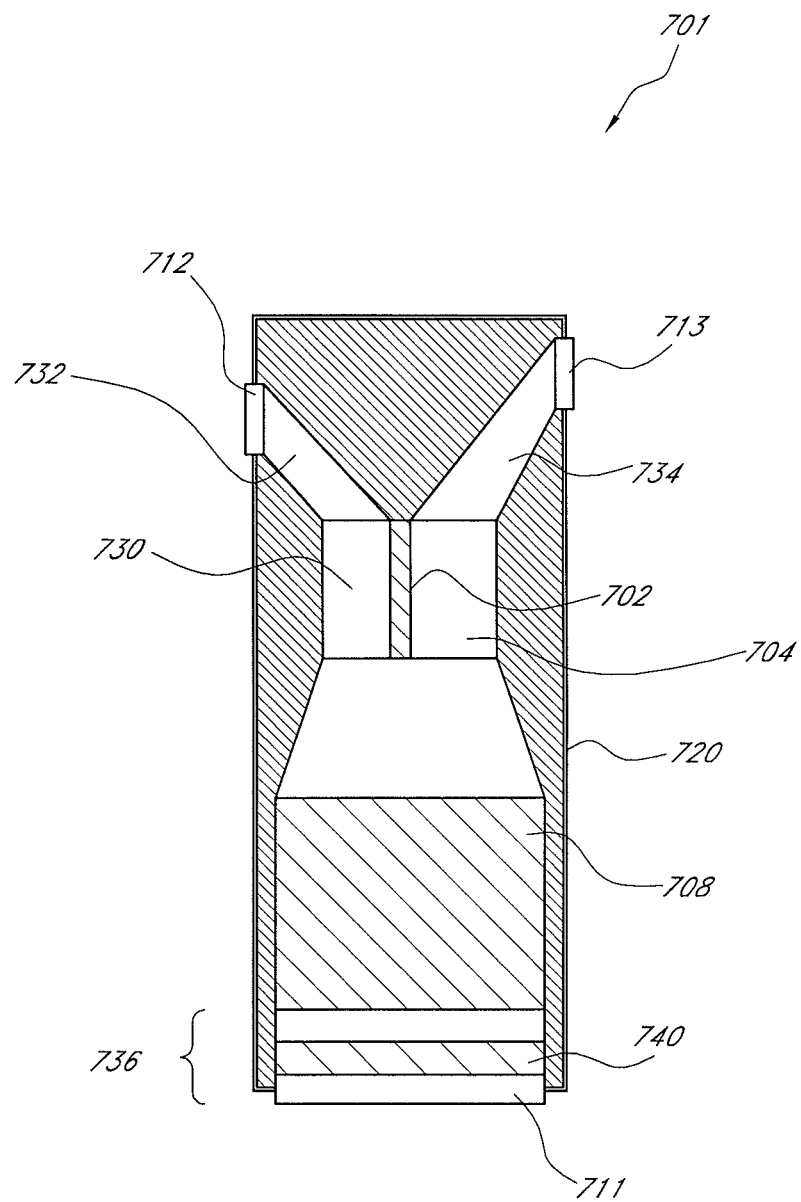
FIG. 8 schematically illustrates a cross-sectional view of an example appliance in accordance with certain embodiments described herein.

In certain embodiments, the ducts 112, 115, 116, 117, and 120 are made of thermally insulative material. As shown in FIG. 1 and FIG. 8, they are separate parts. They are advantageously constructed from one or more insulative inserts (e.g. made from a material such as Gecet® foam) shaped to provide necessary ducts along with cavities in which the fan assembly, the TE module with the heat exchangers, and the flow-directing device may rest.

Figure 2:
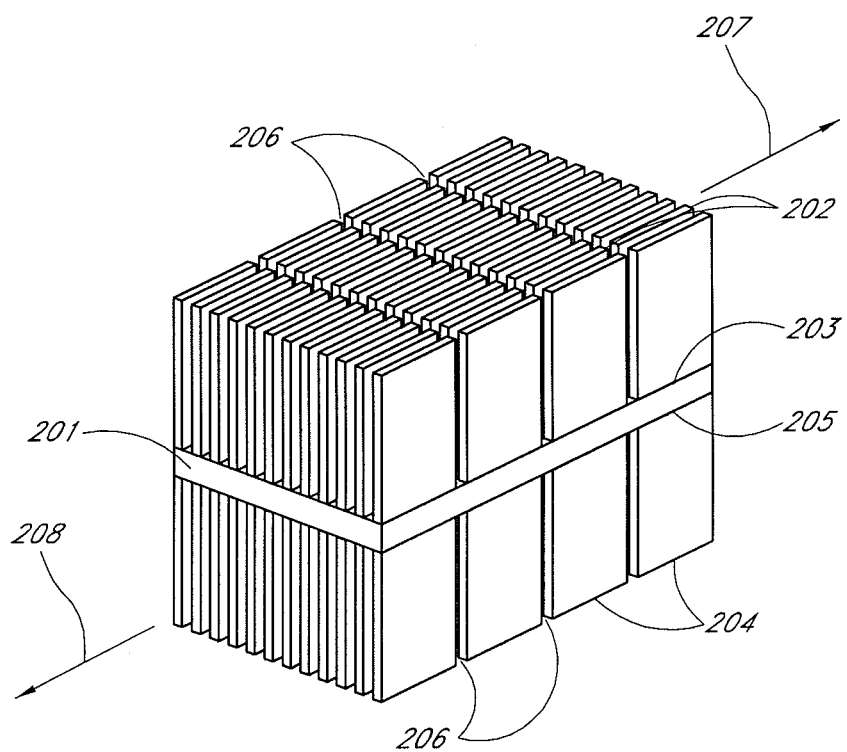
FIG. 2 schematically illustrates an example thermoelectric device and heat exchanger portion of the thermoelectric personal environment appliance in which thermal isolation in the direction of flow is employed to improve performance and efficiency.

The performance of the personal environment appliance may be improved by modifications to the thermoelectric module and heat exchanger portion as shown in FIG. 2. This modification is to provide thermal isolation in the direction of flow as described in U.S. Pat. No. 6,539,725, which is incorporated in its entirety by reference herein.

The thermoelectric module 201 of certain embodiments is in good thermal contact with a plurality of heat exchangers 202 on its main side 203 and in good thermal contact with a plurality of heat exchangers 204 on its waste side 205. As shown in FIG. 2, the heat exchangers of certain embodiments are fin structures. Other types of heat exchangers can be used instead in other certain embodiments. The good thermal contact with the thermoelectric module can be achieved with thermal grease or with thermally conductive glue. If grease is used, certain embodiments advantageously provide a clamping force to hold the heat exchangers 202 and 204 firmly against the TE module 201. The heat exchangers 202 on the main side 203 can be separated from each other along the direction 207 of fluid flow along the main side 203 by gaps 206 and the heat exchangers 204 on the waste side 205 can be separated from each other along the direction 208 of fluid flow along the waste side 205 by gaps 206. The main 203 and waste 205 sides of the TE module 201 of certain embodiments are made of a ceramic material. The sufficiently low thermal conductivity of the sides 203 and 205 of the TE module 201 in certain embodiments, along with the presence of the gaps 206, provides an acceptable amount of thermal isolation from one heat exchanger to the next. The arrows in the diagram show the flow directions 207, 208 along the main side 203 and the waste side 205 of the thermoelectric module 201. In certain embodiments, the flow is counter-flow with the main and waste flows in opposite directions. However, this is not necessary, and flow along the same direction or non-parallel directions is also possible in certain other embodiments.

The personal environment appliance 101 may be configured to be situated within the work area in a variety of ways. For example, it may simply rest on a work surface, in which case the air inlet advantageously is at the bottom, with the bottom surface raised from the work surface to allow air to enter. As another example, the appliance may be suspended from a work surface such as a bookshelf by means of a slot, located below, but near the upper surface of the appliance, which hooks over a portion of the shelf. In such configurations, the air intake can be on the bottom of the appliance. As yet another example, mounting holes or mounting brackets could be supplied serving to permanently attach the appliance to a convenient surface in the work area. In addition, certain embodiments described herein can also be applied in many circumstances in living areas of homes and apartments. The deployment and use in certain such embodiments is similar to that in the workplace, being focused on individual localized comfort.

Figure 3:
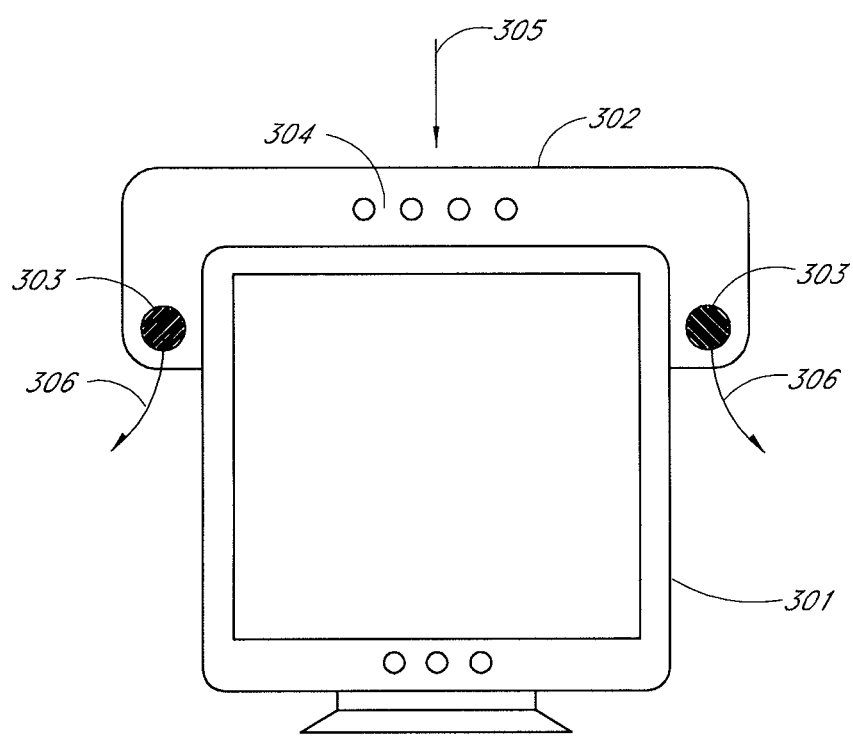
FIG. 3 schematically illustrates an example thermoelectric personal environment appliance on a computer monitor.

Another example is to configure the housing and the internal organization of the appliance to mount on and around the periphery of a computer monitor. FIG. 3 shows such an example device. The personal environment appliance 302 rests on top of the computer monitor 301 and, as shown, has the main outlet ports 303 to the side of the monitor. User controls 304 can be conveniently located above the top of the monitor 301 on the front face of the appliance 302. In this example, air 305 enters at the top of the appliance 302. Conditioned air 306 exits to the front from the main outlet ports 303 while waste air exits out the back (not shown) in this embodiment. Waste air could be directed to another area in another embodiment. In one embodiment, an anti-glare screen could be provided with the appliance to cover the computer screen.

Figure 4:
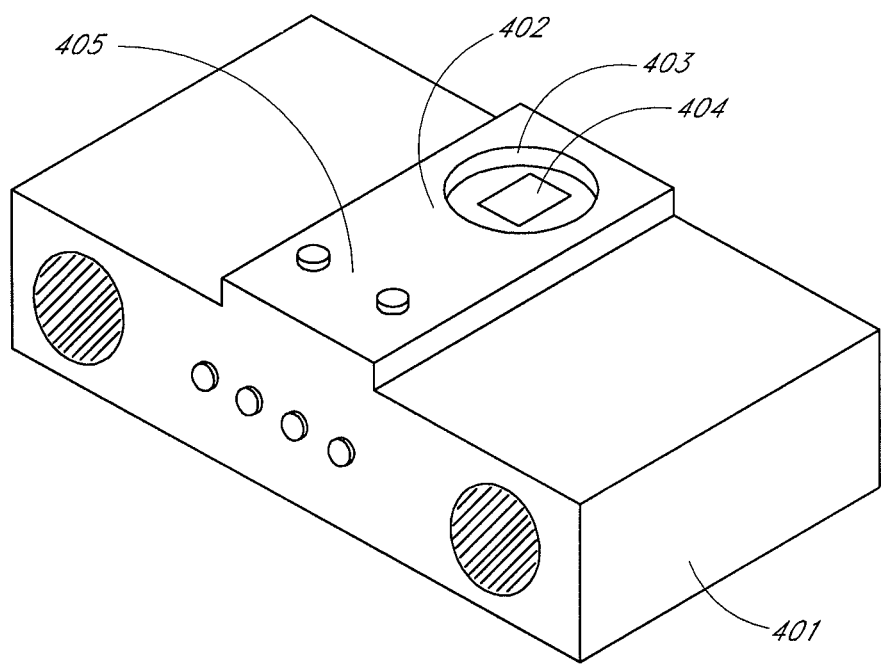
FIG. 4 schematically illustrates an example personal environment appliance including a beverage cooler and/or heater.

Other features may be added to the thermoelectric personal environment appliance. In the examples of the appliance suspended from or attached to work place furniture, in certain embodiments, a light is added to provide illumination of a work surface below the appliance. In certain such embodiments, the light is fluorescent to minimize heat generation and to provide diffused light. FIG. 4 shows the addition of a beverage heater and/or cooler. The housing 301 of certain such embodiments includes, as an example, the platform 402 within which is a substantially circular recess 403 sized to fit typical cups, mugs, or cans. Within the recess 403 is a thermoelectric module 404. Within the housing 401, and attached to the underside of the thermoelectric module 404 is a heat exchanger (not shown) located so that the waste air pathways (suitably modified) include the heat exchanger. User operable controls 405 for choosing heating or cooling and for choosing the amount of heating or cooling can be located on, or protrude from, the housing 401. The beverage heater/cooler portion of the appliance can be powered by the same power supply that powers the climate control portion or it can be separate.

The use of sound machines can be beneficial in producing a calming and pleasant environment. The fan of the personal environmental appliance in certain embodiments described herein produces a slight noise which, by suitable design, can be adjusted in amplitude and character. In addition, in certain embodiments, speakers may be added to the appliance to generate sound from an external signal source such as a computer CDROM drive and sound card. The speakers can be powered either by the power supply 105 or by an external supply. The speakers or yet a separate sound system may be added to cancel unwanted noise either from the environment or emanating from the device itself. These configurations can be within the framework of those described above or can be integrated with a configuration designed to be mounted on a computer monitor as shown in FIG. 3 modified to extend the side arms enough to accommodate the speakers.

By taking advantage of the presence of the thermoelectric cooling present in the appliance, a small refrigerator may be added. In operation for personal heating or cooling, cool air is always generated, whether on the main or on the waste side. A portion of this air may be routed to an insulated box suitable for holding a small quantity of food or beverages, augmenting the number of thermoelectric elements and the capacity of the DC power supply as needed to supply the additional cooling required. In this configuration, the user controls are configured to allow the user to control the personal heating and cooling as desired while leaving the refrigerator running. To route cool air to the refrigerator regardless of the state of the heat/cool control, an electrically operated valve or vane, for example, can be operated in response to the heat/cool switch setting to obtain the cool air from the proper duct. When the user has turned off the personal heating or cooling, the thermoelectric module and fan can be under the control of a standby circuit by which the proper amount of air circulation and power to the TE module can be determined and adjusted on the basis of a temperature measurement, by a thermistor, for example, of the refrigerator compartment.

A workspace or work area organizer feature may be added to the appliance. For example, in certain embodiments, the appliance can include an appendage to the housing with compartments for writing implements, memo pads, and other materials commonly found in the work place.

Figure 5:
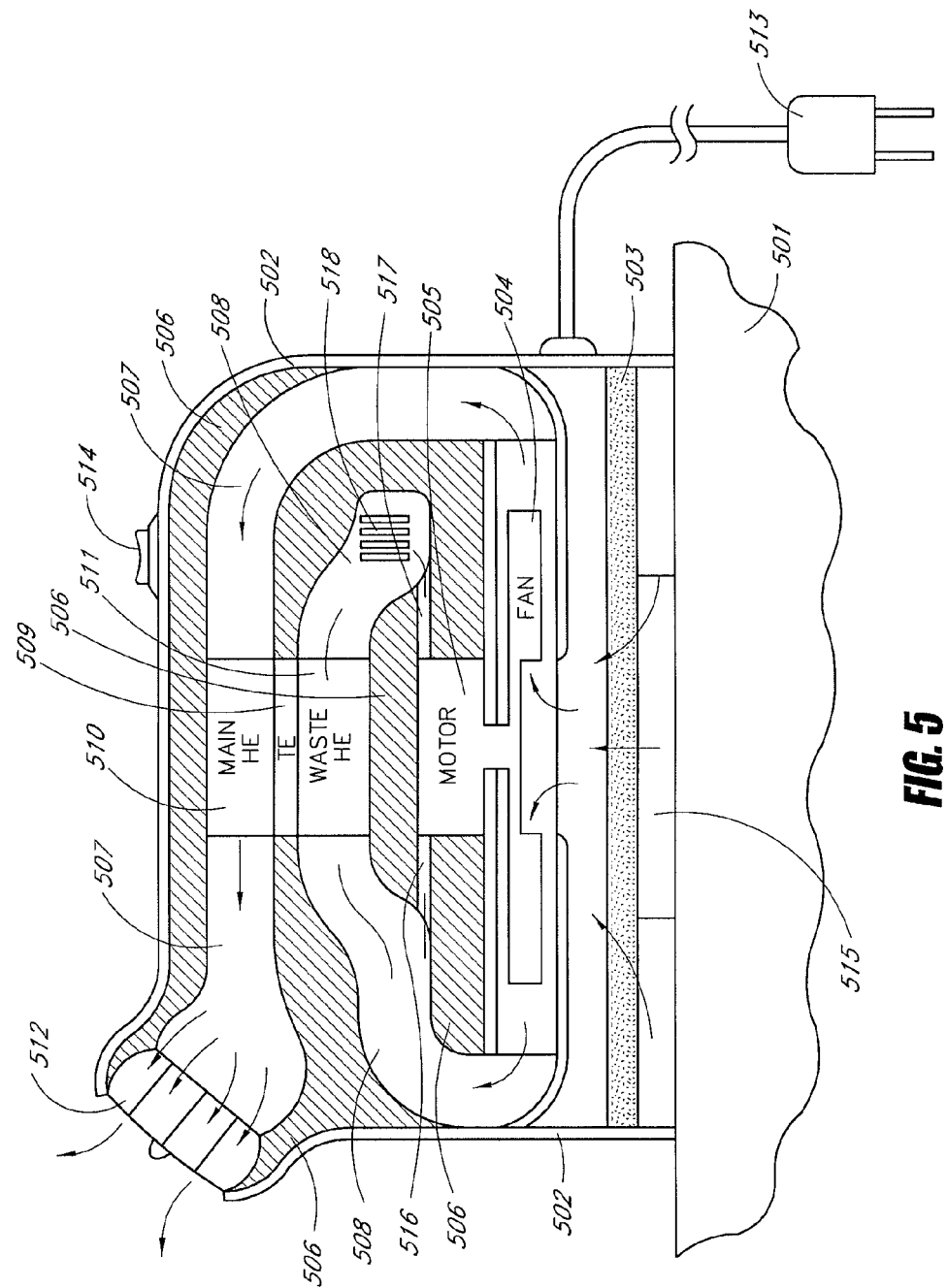
FIG. 5 schematically illustrates an example thermoelectric personal environment appliance intended for use on a surface.

FIG. 5 depicts another particular embodiment, in cross section, of a thermoelectric personal environment appliance designed to be placed on a surface 501 (e.g. a work surface). A housing 502 encloses an optional filter 503 (which in certain embodiments is replaceable), a fan 504 with fan motor 505, several inserts 506, together forming a main side duct 507 and a waste side duct 508. Advantageously, the inserts are insulative. A thermoelectric module 509 can be located between the main side duct 507 and the waste side duct 508 and can be in good thermal contact with a main side heat exchanger 510 residing within the main side duct 507 and with a waste side heat exchanger 511 residing within the waste side duct 508. In certain embodiments, a flow director 512 is positioned within the left hand end of the main side duct 507 as shown in FIG. 5. Electricity to power the thermoelectric device 509 and the fan motor 505 can be supplied from AC power through a cord and wall plug 513. User operable controls 514 can allow the user to choose on/off, cool/heat, and high/low.

In certain embodiments, air enters the housing at its base through one or more ports 515 in the housing 502. The air passes through the filter 503, being drawn in by the fan 504. The air leaving the fan enters the main side duct 507 and the waste side duct 508 so as to pass through the main side heat exchanger 510 and the waste side heat exchanger 511 in opposite directions as shown. By rearrangement of the ducts 507 and 508, the flow can also be in the same direction. Advantageously, in certain embodiments, the assembly including the thermoelectric module 509, the main side heat exchanger 510, and the waste side heat exchanger 511 is constructed with thermal isolation in the direction of flow as described above in FIG. 2.

In certain embodiments, a small motor cooling duct 516 leads off the waste side duct 558 prior to its entrance to the waste side heat exchanger 511 and supplies air to cool the motor 505. After passing around the motor 505, the air leaves the motor cavity via another small motor air exit duct 517 that rejoins the waste side duct 508 after the waste side heat exchanger 511. All of the air passing through the waste side duct 508 can be expelled from the device through vents 518 positioned advantageously to direct the air away from the side of the device where the flow director 512 is located. As shown in FIG. 5, that direction can be normal to the plane of the cross-section.

In certain embodiments, air within the main side duct 507 passes through the main side heat exchanger 510 where it is cooled or heated according to the setting of the user operable controls 514. In certain embodiments, air leaving the main side heat exchanger 510 passes through the flow director 512 that the user may adjust to direct the flow according to desires.

In certain embodiments, the fan motor 505 is a two speed, AC fan and the DC for the thermoelectric module 509 is produced from the AC according to methods known in the art, such as full wave (user operable controls 514 set to high) or half wave (user operable controls 514 set to low) rectification without the need for filtering.

Several filtration systems can be used to improve the quality of air conditioned by the appliance in certain embodiments described herein. Electrostatic filtration is well known to the art and can be incorporated in either the stream of the conditioned air or within the inlet so that both the conditioned and waste air are filtered. Alternately, other forms of filtration may be used for the same purposes. Organic vapors and other contaminants can be removed by incorporating an absorptive filter medium such as an activated charcoal, or a combination of several media with complementary absorptive properties. Alternately, humidity, air freshening aromas or fragrances, cleansing agents, disinfectants and/or other air modifiers can be added to the air streams to improve system functionality. The filter may also include ionic functionality.

The conditioned air can be controlled in certain embodiments described herein in several ways. The air can be guided so as to sweep periodically through an angle, such as by automatically swiveling the nozzle back and forth. The outlet can be provided with the capability of focusing the conditioned air into a narrow angle, or dispersing the conditioned air over a broad angle by incorporating a suitable diffuser mechanism into the nozzle, for example as has been done in some aircraft passenger ventilator systems. Provisions can be designed to allow the air output direction to be manually adjusted.

In certain embodiments, the appliance can operate during a specific period of time, or can turn itself off after a given amount of time has elapsed. To provide this capability, a timer control mechanism including a clock can be incorporated into the appliance control system 106. A user either sets the times the appliance is to start and stop, or alternately, the user sets the length of time the appliance is to operate, with the appliance turning itself off when the specified time has elapsed.

As an additional feature, a clock and alarm can be incorporated into certain embodiments described herein. In certain other embodiments, the appliance is integrated into the base of a freestanding desk lamp, thereby combining the functionality of the two devices. Various configurations of the appliance could be integrated in this manner.

Figure 6A:
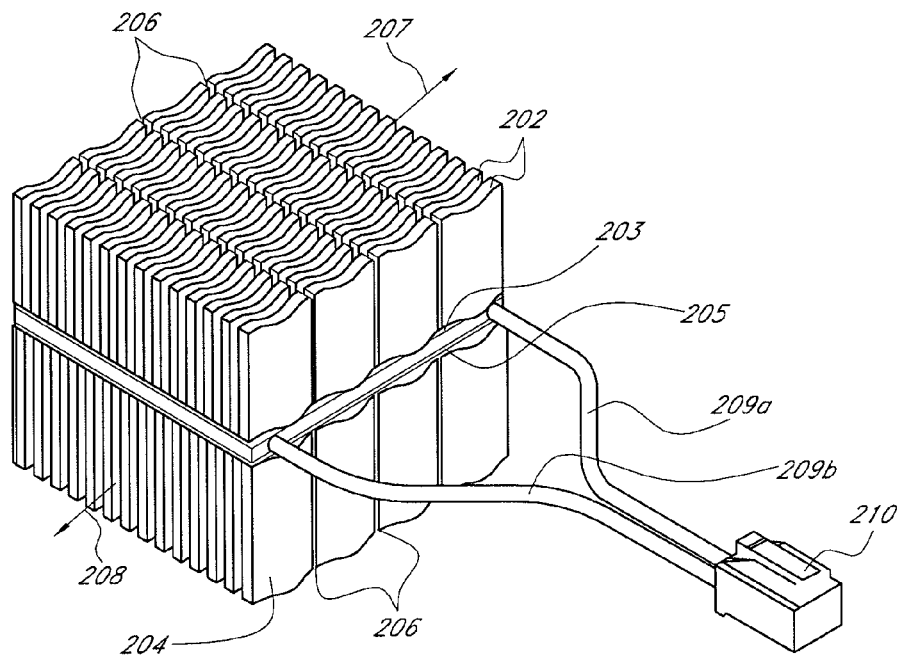
FIGS. 6A and 6B schematically illustrate two example configurations of heat exchangers in accordance with certain embodiments described herein.
Figure 6B:
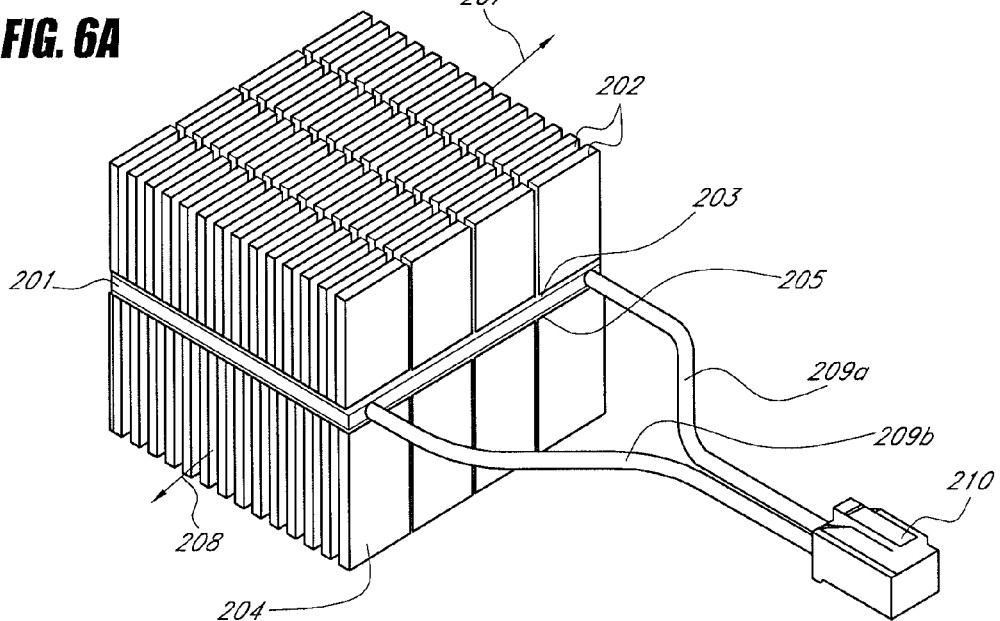

FIGS. 6A and 6B schematically illustrate two example configurations of heat exchangers in accordance with certain embodiments described herein. In certain embodiments, the heat exchangers 202, 204 comprise fins which are in thermal communication with the sides 203, 205 of the thermoelectric module 201. As shown in FIGS. 6A and 6B, the heat exchangers 202 are in good thermal contact with the main side 203 of the thermoelectric module 201, and the heat exchangers 204 are in good thermal contact with the waste side 205 of the thermoelectric module 201. Adjacent heat exchangers 202 are generally parallel to one another and spaced apart from one another such that fluid can flow between them in the direction 207, thereby allowing heat transfer between the heat exchangers 202 and the fluid flowing in the direction 207. Adjacent heat exchangers 204 are generally parallel to one another and spaced apart from one another such that fluid can flow between then in the direction 208, thereby allowing heat transfer between the heat exchangers 204 and the fluid flowing in the direction 208. In certain other embodiments, the heat exchangers 202 are not generally parallel to one another, and/or the heat exchangers 204 are not generally parallel to one another.

In FIG. 6A, the heat exchangers 202 have a curved shape generally along the direction 207 such that the fluid flow curves along the main side 203. In FIG. 6B, the heat exchangers 202 have a straight shape generally along the direction 207 such that the fluid flow is generally straight along the main side 203. FIGS. 6A and 6B also illustrate that the heat exchangers 204 can have a curved shape or a straight shape generally along the direction 208, thereby affecting the fluid flow. Other shapes of heat exchangers are also compatible with certain embodiments described herein.

In certain embodiments, rows of heat exchangers 202 are separated from one another along the direction 207 of fluid flow along the main side 203 by gaps 206, and rows of heat exchangers 204 are separated from one another along the direction 208 of fluid flow along the waste side 205 by gaps 206. In certain such embodiments, the heat exchangers 202 are generally thermally isolated from one another along the direction 207 of fluid flow, and the heat exchangers 204 are generally thermally isolated from one another along the direction 208 of fluid flow.

Figure 7A:
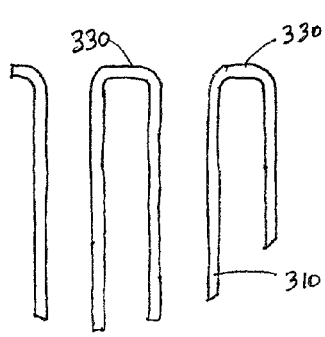
FIGS. 7A and 7B schematically illustrate details of a heat exchanger in accordance with certain embodiments described herein.
Figure 7B:
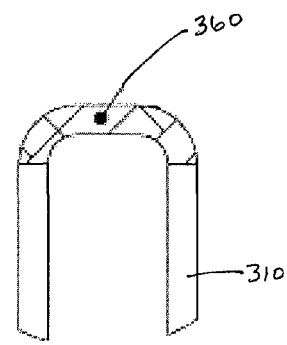
Figure 7C:
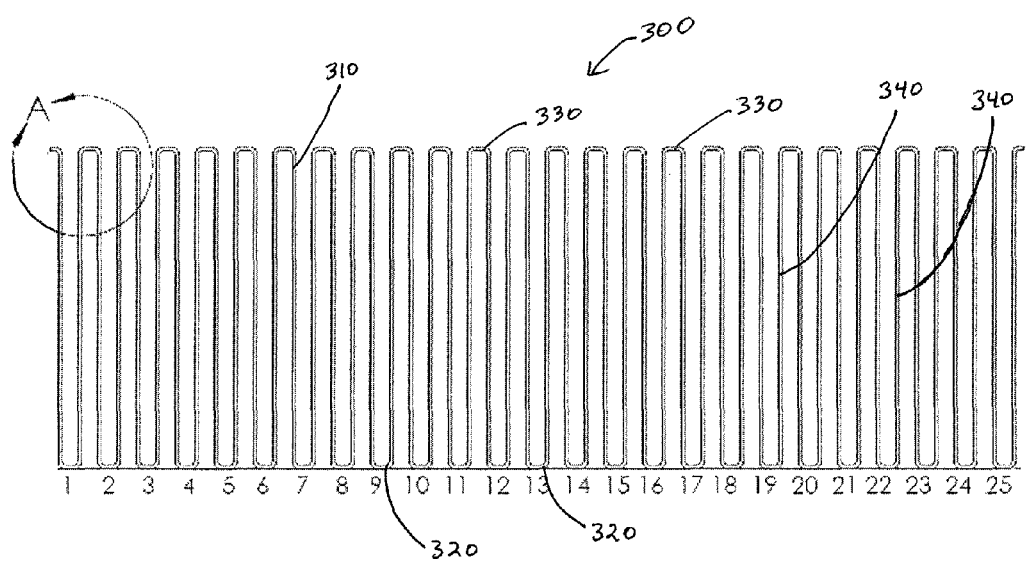
FIG. 7C schematically illustrates a side view of the heat exchanger along a direction of air flow through the heat exchanger.
Figure 7D:
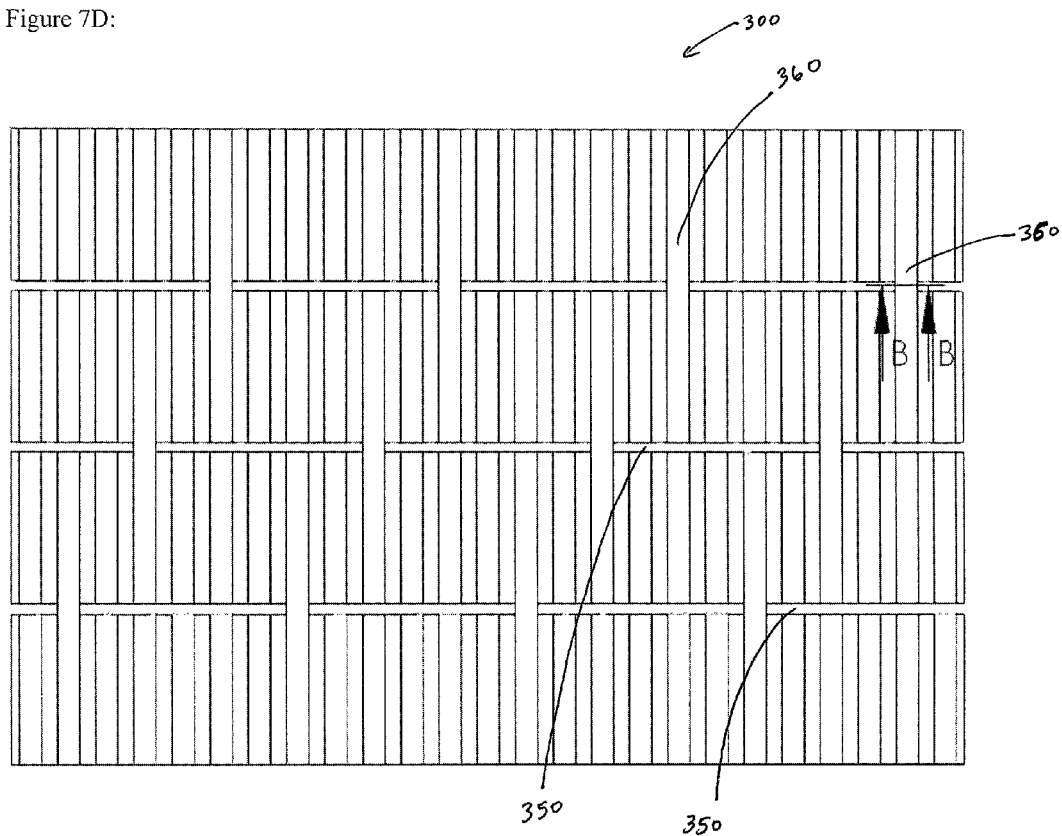
FIG. 7D schematically illustrates a top view of the heat exchanger along a direction generally perpendicular to the direction of air flow through the heat exchanger.
Figure 7E:
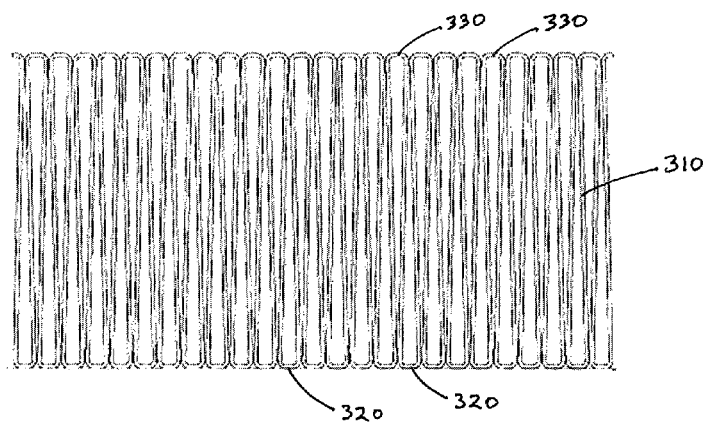
FIG. 7E schematically illustrates a side view of a compressed heat exchanger.
Figure 7F:
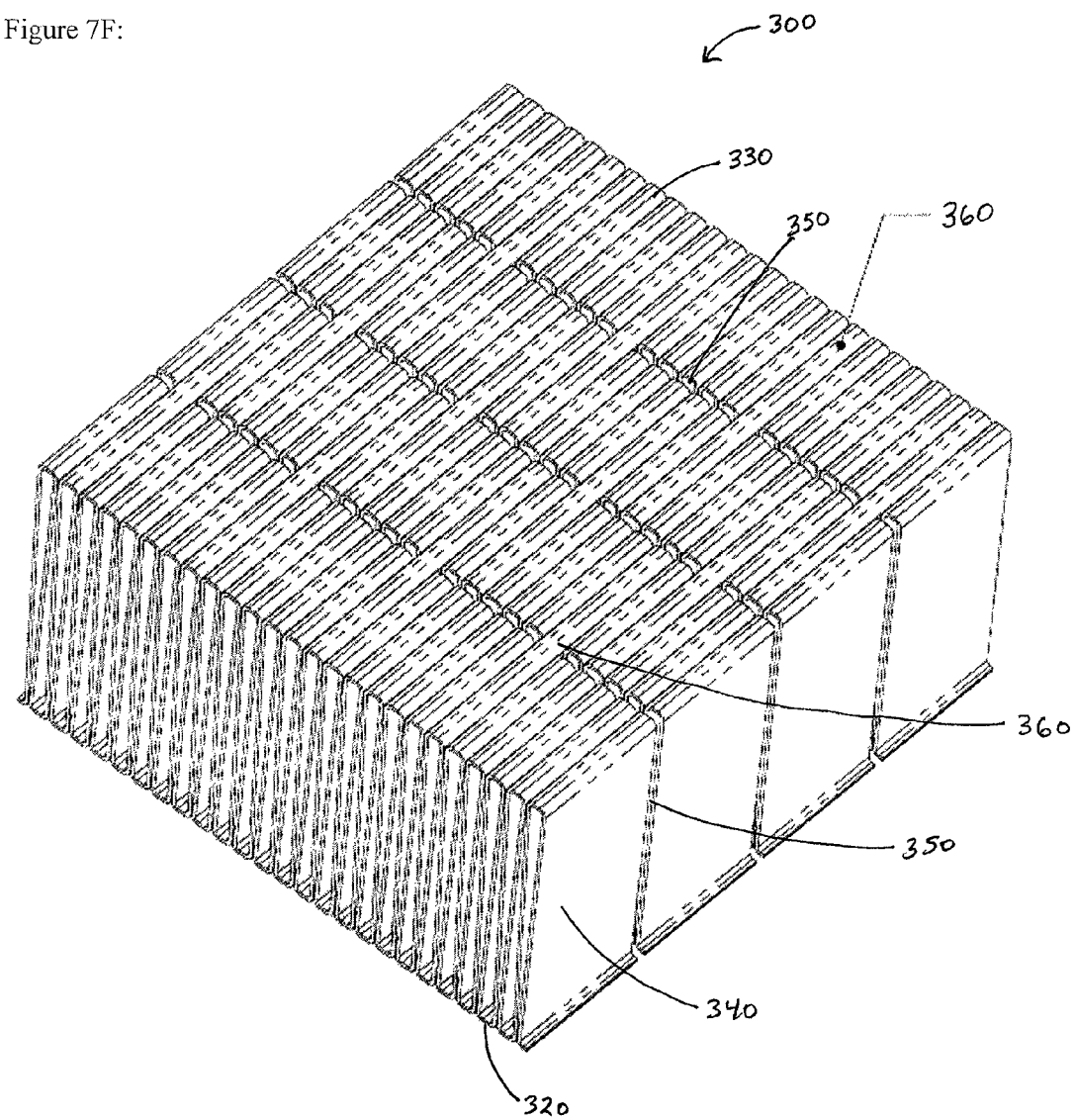
FIG. 7F schematically illustrates a perspective view of the heat exchanger.

FIGS. 7A-7F schematically illustrate an example heat exchanger 300 in accordance with certain embodiments described herein. FIGS. 7A and 7B schematically illustrate details of the heat exchanger 300. FIG. 7C schematically illustrates a side view of the heat exchanger 300 along a direction of air flow through the heat exchanger 300. FIG. 7D schematically illustrates a top view of the heat exchanger 300 along a direction generally perpendicular to the direction of air flow through the heat exchanger 300. FIG. 7E schematically illustrates a side view of a compressed heat exchanger 300. FIG. 7F schematically illustrates a perspective view of the heat exchanger 300.

In certain embodiments, the heat exchanger 300 can be used on the main side 203, on the waste side 205, or both. In certain embodiments, the heat exchanger 300 comprises at least one thermally conductive sheet 310 (e.g. Al 1060 anneal or 0 temper) having a thickness (e.g. 0.25 millimeter). The thermally conductive sheet 310 has a first plurality of folds 320 (e.g. 20-30 folds) and a second plurality of folds 330 (e.g. 20-30 folds) such that the sheet forms a plurality of fins 340 (e.g. 30-60 fins). FIG. 7A schematically illustrates a pair of adjacent folds 330 in accordance with certain embodiments described herein. As shown schematically in FIG. 7C, the thermally conductive sheet 310 is folded back and forth to form an accordion-like fin structure. In certain embodiments, as schematically illustrated by FIGS. 7E and 7F, the heat exchanger 300 can be compressed in a direction generally perpendicular to the direction of flow, such that adjacent folds 320 contact one another and adjacent folds 330 contact one another. In certain embodiments, such a heat exchanger 300 comprising a plurality of folded fins 340 can advantageously avoid problems due to thermal expansion mismatch between the material of the fins and the thermoelectric module 201, which would otherwise occur if a large standard fin having a thermal expansion coefficient were glued to a thermoelectric module 201 having a different (e.g. lower) thermal expansion coefficient.

In certain embodiments, the first plurality of folds 320 are in thermal communication with either the main side 203 or the waste side 205 of the thermoelectric module 201. The folds 320 can be attached to a side of the thermoelectric module 201 and can serve as contact points between the heat exchanger 300 and the thermoelectric module 201, or the folds 320 can be held in proximity to a side of the thermoelectric module 201 with an intervening material therebetween to enhance thermal conductivity between the thermoelectric module 201 and the heat exchanger 300. For example, adhesive (e.g., thermally conductive glue) can be used to attach the heat exchanger 300 to the thermoelectric module 201. In certain other embodiments, a mechanical clip or clamp can be used to hold the heat exchanger 300 in place along with a thermally conductive grease or a phase-change material (e.g. thermally conductive wax) providing thermal conductivity between the thermoelectric module 201 and the heat exchanger 300.

In certain embodiments, the fins 340 are generally thermally isolated from one another along the corresponding direction 207, 208 of fluid flow. At various locations, the heat exchanger 300 comprises a plurality of gaps 350 between adjacent fins 340 along the direction of air flow, as schematically illustrated by FIGS. 7D and 7F. For example, in certain embodiments, the thermally conductive sheet 310 can have a plurality of slots cut into the sheet 310 prior to the folding of the sheet 310. Upon folding the sheet 310 to form the fins 340, the slots form the gaps 350.

In certain embodiments, the heat exchanger 300 comprises one or more bridges 350 which provide additional structural integrity to the heat exchanger 300. For example, as schematically shown in FIGS. 7D and 7F, the bridges 360 can comprise portions of the sheet 310 between the slots which form the gaps 350. Upon folding the sheet 310 to form the fins 340, each bridge 360 connects two adjacent fins 340 in the direction of air flow. However, in certain embodiments, the bridge 360 is sufficiently small such that it does not provide an appreciable amount of thermal conductivity between the two fins 340 to which it is coupled. FIG. 7B schematically illustrates a cross-sectional view of a bridge 360 in accordance with certain embodiments described herein. In certain embodiments, the bridges 350 are distributed generally uniformly across the heat exchanger 300 (e.g. bridge 360 placed after every 6 fins in a direction generally perpendicular to the direction of air flow, staggered between rows of fins 340 by two fins 340).

In certain embodiments, the second plurality of folds 330 are coupled to a thermally insulative sheet (e.g. laminate or adhesive-backed tape film) generally parallel to the side of the thermoelectric module 201. The thermally insulative sheet can be attached to the folds 330 to provide additional structural stability to the heat exchanger 300 by holding the multiple sets of thermally isolated fins 340 together without providing thermal conductivity between the fins 340 along the direction of air flow. In certain embodiments, the thermally insulative sheet also at least partially bounds the flow conduit through which air flows. In certain such embodiments, the thermally insulative sheet seals the sides of the air channels between the fins 340 through which air flows while maintaining the general thermal isolation along the direction of air flow. The structural stability provided by the thermally insulative sheet of certain embodiments advantageously allows fabrication of the heat exchangers 202, 204 and the mounting of the heat exchangers 202, 204 to the thermoelectric module 201 to be performed relatively inexpensively. For example, rather than having to position individual fins on the thermoelectric module 201, the heat exchanger 300 can be positioned as a unit, thereby making fabrication simpler.

In certain embodiments, as shown in FIGS. 6A and 6B, the thermoelectric module 201 is electrically coupled to an electrical connector 210 by wires 209 (e.g. 20 AWG). In certain such embodiments, when wire 209a has a positive voltage applied, the heat exchangers 202 on the main side 203 are hot and the heat exchangers 204 on the waste side 205 are cold. In certain embodiments, the electrical connector 210 is configured to be coupled to a corresponding receptacle such that the wires 209 are in electrical communication with an electrical power source.

FIG. 8 schematically illustrates a cross-sectional view of an example appliance 701 in accordance with certain embodiments described herein. The appliance 701 comprises at least one inlet port 711. In certain embodiments, a first portion 736 (e.g. a base portion) of the appliance 701 comprises the at least one inlet port 711. The appliance 701 further comprises at least one thermoelectric module 702 comprising a main flow conduit 703 and a waste flow conduit 704. The at least one thermoelectric module 702 is over the at least one inlet port 711. The appliance 701 further comprises at least one main outlet port 712 and at least one waste outlet port 713. In certain embodiments, the appliance 701 comprises a second portion 720 (e.g. a housing) which comprises the at least one main outlet port 712 and the at least one waste outlet port 713. The at least one main outlet port 712 is spaced from the at least one inlet port 711 and is in fluidic communication with the main flow conduit 703. The at least one waste outlet port 713 is spaced from the at least one inlet port 711 and is in fluidic communication with the waste flow conduit 704. The appliance 701 further comprises at least one filter 740 between the at least one inlet port 711 and the at least one thermoelectric module 702.

In certain embodiments, the main flow conduit 703 and the waste flow conduit 704 each comprises a heat exchanger assembly, for example, a plurality of fin heat exchangers as schematically illustrated by FIGS. 6A and 6B. In the example appliance 701 of FIG. 8, the fluid flow along the main flow conduit 703 is parallel and in the same general direction as the fluid flow along the waste flow conduit 704. In certain other embodiments, the fluid flow along the main flow conduit 703 and along the waste flow conduit 704 are parallel but in opposite directions. Other configurations of fluid flow directions along the main and waste flow conduits 703, 704 are also compatible with various embodiments described herein.

The appliance 701 further comprises at least one fan 708 driven by at least one motor and a plurality of fins (not shown). In certain embodiments, the at least one fan 708 draws fresh air through the at least one inlet port 711 into the appliance 701. A first portion of the air drawn in through the at least one inlet port 711 is forced by the at least one fan 708 through the main flow conduit 703 and through the at least one main outlet port 712. A second portion of the air drawn in through the at least one inlet port 711 is forced by the at least one fan 708 through the waste flow conduit 704 and through the at least one waste outlet port 713. In certain embodiments, the fin heat exchangers of the main flow conduit 703, the fin heat exchangers of the waste flow conduit 704, and the air flow are optimized for optimal heating and/or cooling.

In certain embodiments, as shown in FIG. 8, the at least one waste outlet port 713 is spaced away from the at least one main outlet port 712 and away from the at least one inlet port 711, thereby advantageously avoiding or reducing heat recirculation. The at least one waste outlet port 713 of certain embodiments is positioned close to the waste flow conduit 704, thereby advantageously providing improved heat removal from the appliance 701. In certain embodiments, the at least one main outlet port 712 is on a first side of the appliance 701 and the at least one waste outlet port 713 is on a second, different side of the appliance 701. For example, as schematically illustrated in FIG. 8, the at least one waste outlet port 713 is positioned at or near a top portion of the appliance 701 and on an opposite side of the appliance 701 from the at least one main outlet port 712. In certain such embodiments, the first air flow through the at least one main outlet port 712 is generally towards a user of the appliance 701 and the second air flow through the at least one waste outlet port 713 is in a generally upward direction away from the user (e.g., advantageously allowing heat from the waste flow conduit 704 to rise away from the appliance 701 and the user of the appliance 701).

Figure 9:
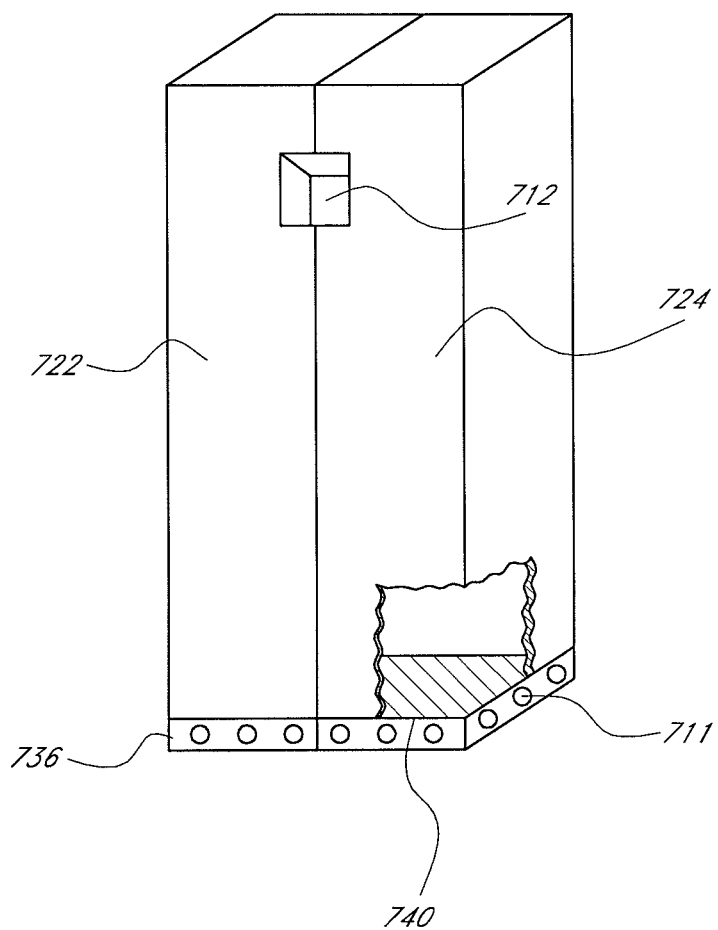
FIG. 9 schematically illustrates a perspective, partially-cut-away view of the appliance of FIG. 8.

FIG. 9 schematically illustrates a perspective, partially-cut-away view of the appliance 701 of FIG. 8. The second portion 720 of the appliance 701 further comprises at least a first element 722 and a second element 724. In certain embodiments, each of the first element 722 and the second element 724 forms approximately one-half of the second portion 720, as shown in FIG. 9. In certain embodiments, the first element 722 and the second element 724 fit together in a "clam shell" configuration, which facilitates easy assembly of the appliance 701. The first and second elements 722, 724 can be affixed together (e.g., by glue) and/or they can have corresponding protrusions and recesses which snap together to form the second portion 720.

In certain embodiments, when assembled together to form the second portion 720, the first and second elements 722, 724 form a main flow path 732 from the main flow conduit 703 to the at least one main outlet port 712 and form a waste flow path 734 from the waste flow conduit 704 to the at least one waste outlet port 713. For example, in certain embodiments, each of the first and second elements 722, 724 have hollow or cut-out regions which, when placed adjacent to one another, form the main flow path 732, the waste flow path 734, or both the main and waste flow paths 732, 734. In certain embodiments, the first and second elements 722, 724 comprise one or more recesses and one or more protrusions which interlock or otherwise mate together when the first and second elements 722, 724 are assembled to form the second portion 720 so as to provide a substantially airtight seal of the main flow path 732, the waste flow path 734, or both. In the cross-sectional view of FIG. 8, the first element 722 extends from the main flow path 732 to an outer shell of the second portion 720 and extends from the waste flow path 734 to the outer shell of the second portion 720.

In certain embodiments, each of the first element 722 and the second element 724 comprises a thermally insulative material which forms the main and waste flow paths 732, 734 and which thermally isolates the main flow path 732 from the waste flow path 734. In addition, in certain embodiments, the thermally insulative material of the first and second elements 722, 724 thermally isolate the main flow path 732 from the external surface of the appliance 701 and thermally isolate the waste flow path 734 from the external surface of the appliance 701. Examples of materials compatible with certain embodiments described herein include, but are not limited to, Gecet® foam, Styrofoam®, and low density plastic.

In certain embodiments, the at least one inlet port 711 is positioned away from the at least one waste outlet port 713. In this way, certain embodiments advantageously avoid having air enter the at least one inlet port 711 directly from the at least one waste outlet port 713. The first portion 736 comprising the at least one inlet port 711 of certain embodiments is configured to be positioned on a surface (e.g., a substantially horizontal surface of a table or floor) during operation of the appliance 701 to support the appliance 701. The at least one inlet port 711 is configured to allow air to flow into the appliance 701 when the appliance 701 is placed on a surface. For example, as shown in FIG. 9, the at least one inlet port 711 of certain embodiments comprises a plurality of holes along the periphery of the first portion 736.

In certain embodiments, the at least one filter 740 is within the appliance 701 between the at least one inlet port 711 and the at least one fan 708. In certain other embodiments, the at least one filter 740 is between the at least one fan 708 and the at least one thermoelectric module 702. By having the air propagate through the at least one filter 740 prior to reaching the at least one thermoelectric module 702, the main flow conduit 703, and the waste flow conduit 704, certain embodiments advantageously avoid or reduce the degree to which these components from getting dirty or clogged by particulate matter within the flowing air. Furthermore, in certain embodiments, by having the at least one filter 740 in either the first portion 736 or the second portion 720 below the at least one thermoelectric module 702, condensation from the at least one thermoelectric module 702, the main flow conduit 703, and/or the waste flow conduit 704 can drip (e.g., in a downward direction) onto the at least one filter 740, from which it can evaporate into the flowing air. Examples of filters 740 compatible with certain embodiments described herein include, but are not limited to, charcoal, chemical, electrostatic, ionizing, or HEPA filters, or combinations thereof.

In certain embodiments, the first portion 736 can be detached from the rest of the appliance 701 to provide access within the second portion 720 and can be replaced to close the appliance 701. By having the first portion 736 detachable from the rest of the appliance 701, certain embodiments advantageously allow easy replacement of the at least one filter 740.

In certain embodiments, the appliance 701 comprises an element which adds a pleasant smell to the air emitted from the at least one main outlet port 712. This element can be solid or liquid, and can be positioned at one or more positions along the air flow path from the at least one inlet port 711 to the at least one main outlet port 712.

Figures 10A, 10B:
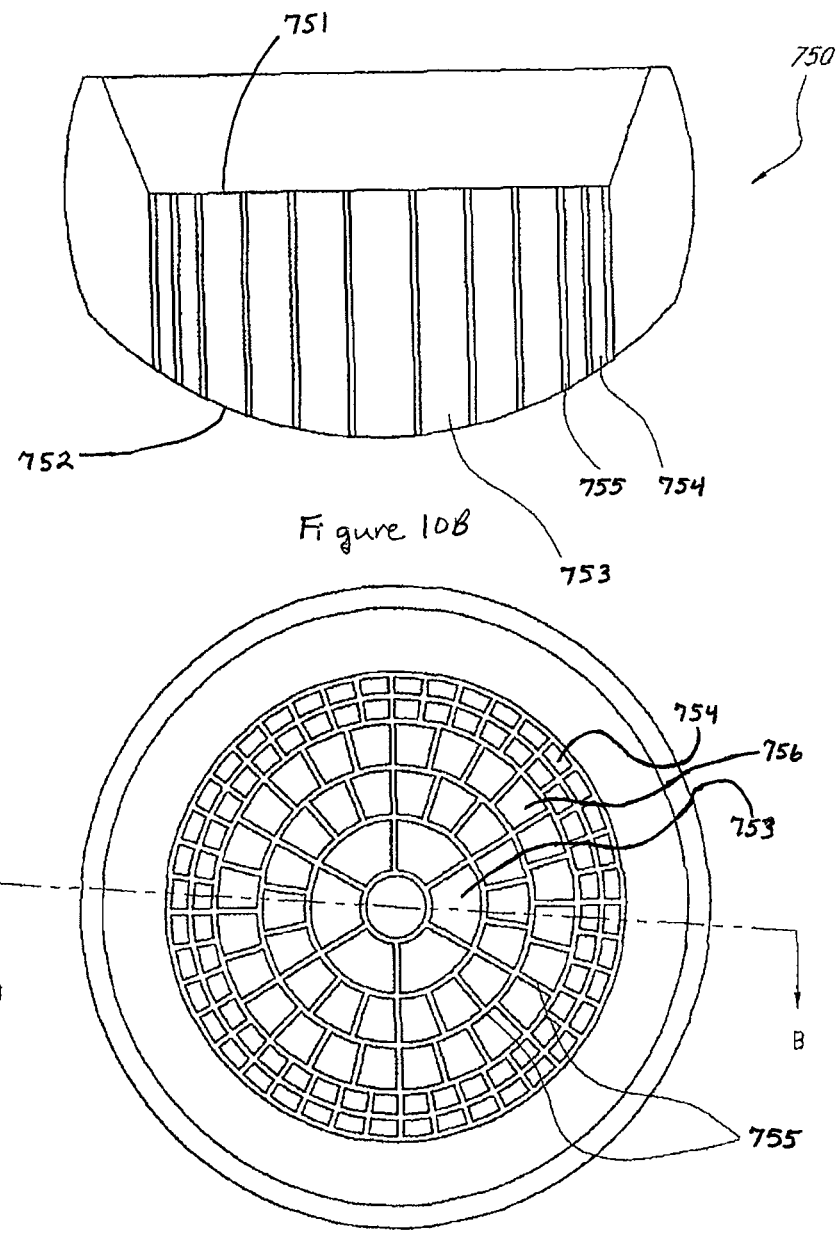
FIG. 10A schematically illustrates an example outlet vent compatible with certain embodiments described herein.
FIG. 10B schematically illustrates a cross-sectional view of the outlet vent of FIG. 9A.

In certain embodiments, the appliance 701 further comprises a outlet vent 750 through which air flowing out of the main outlet port 712 is directed to the user of the appliance 701. FIG. 10A schematically illustrates an example outlet vent 750 compatible with certain embodiments described herein, and FIG. 10B schematically illustrates a cross-sectional view of the outlet vent 750 of FIG. 10A along the dashed line B-B. As schematically illustrated by FIGS. 10A and 10B, the outlet vent 750 of certain embodiments comprises an inlet portion 751 and an outlet portion 752. The outlet vent 750 further comprises a plurality of first tubular conduits 753 generally parallel to one another and extending from the inlet portion 751 to the outlet portion 752 in a first direction. Each first tubular conduit 753 has a length in the first direction, a width in a second direction generally perpendicular to the first direction, and a ratio of the length divided by the width. The outlet vent 750 further comprises a plurality of second tubular conduits 754 generally parallel to one another and extending from the inlet portion 751 to the outlet portion 752 in the first direction. Each second tubular conduit 754 has a length in the first direction, a width in the second direction, and a ratio of the length divided by the width. The plurality of second tubular conduits 754 generally surrounds the plurality of first tubular conduits 753. The ratios of the second tubular conduits 754 are sufficiently large such that air flow from the second tubular conduits 754 is substantially laminar. In certain embodiments, the ratios of the first tubular conduits are also sufficiently large such that air flow from the first tubular conduits 753 is substantially laminar.

In certain embodiments, the outlet vent 750 has an overall thickness (e.g. a distance between the inlet portion 751 and the outlet portion 752 along the first direction) in a range between about 20 millimeters and about 100 millimeters, and in certain other embodiments, the overall thickness of the outlet vent 750 is about 60 millimeters. In certain embodiments, the outlet vent 750 has a diameter (e.g. a distance across the outlet vent 750 along a direction generally perpendicular to the first direction) in a range between about 50 millimeters and about 150 millimeters, and in certain other embodiments, the diameter is about 100 millimeters.

In certain embodiments, the outlet vent 750 is rotatably coupled to the second portion 720 and is positionable so that air flowing out of the appliance 701 can be directed in a desired direction. In certain embodiments, the outlet vent 750 is configured to swivel through an angle in a range between ±60 degrees, ±45 degrees, or ±30 degrees. In certain embodiments, the angle of the outlet vent 750 is manually set by the user, while in certain other embodiments, the appliance 701 comprises a motor or other mechanism to automatically swivel the outlet vent 750 during operation.

As shown in FIG. 10A, the output vent 750 comprises a plurality of first tubular conduits 753 and a plurality of second tubular conduits 754 in which the various tubular conduits 753, 754 are separated from one another by walls 755 in a generally circular register. For example, the plurality of first tubular conduits 753 and the plurality of second tubular conduits 754 can be arranged in a generally concentric pattern, as schematically illustrated by FIG. 10A. The first and second tubular conduits 753, 754 are generally parallel to one another and air flowing therethrough is directed to flow in a direction generally parallel to the first and second tubular conduits 753, 754. In certain embodiments, each second tubular conduit 754 has a generally rectangular cross-section perpendicular to the first direction, and each first tubular conduit 753 has a generally annulus-sector cross-section perpendicular to the first direction, as schematically illustrated by FIG. 10A.

In certain embodiments, the lengths of the first tubular conduits 753 are in a range between about 20 millimeters and about 60 millimeters, while in certain other embodiments, the lengths of the first tubular conduits 753 are about 40 millimeters. In certain embodiments, the first tubular conduits 753 have about the same length as one another, while in certain other embodiments, at least some of the first tubular conduits 753 have differing lengths from one another. In certain embodiments, the lengths of the second tubular conduits 754 are in a range between about 20 millimeters and about 60 millimeters, while in certain other embodiments, the lengths of the second tubular conduits 754 are about 40 millimeters. In certain embodiments, the second tubular conduits 754 have about the same length as one another, while in certain other embodiments, at least some of the second tubular conduits 754 have differing lengths from one another. In certain embodiments, the first tubular conduits 753 have about the same length as the second tubular conduits 754, while in certain embodiments, at least some of the first tubular conduits 753 have different lengths from at least some of the second tubular conduits 754.

As schematically illustrated by FIGS. 10A and 10B, the first and second tubular conduits 753, 754 of certain embodiments have varying widths. For example, certain embodiments have generally wider first tubular conduits 753 near the center of the outlet vent 750 and generally narrower second tubular conduits 754 around the periphery of the outlet vent 750. In certain embodiments, the ratios of the first tubular conduits 753 are less than the ratios of the second tubular conduits 754. For example, in certain embodiments, the ratios of the first tubular conduits 753 are greater than four, and the ratios of the second tubular conduits 754 are greater than seven. The widths of the first and second tubular conduits 753, 754 in certain embodiments can be expressed as hydraulic diameters. In certain embodiments, each second tubular conduit 754 has a hydraulic diameter in a range between 2 millimeters and 6 millimeters, while in certain other embodiments, each second tubular conduit 754 has a hydraulic diameter of about 4 millimeters. In certain embodiments, each first tubular conduits 753 has a hydraulic diameter in a range between 5 millimeters and 15 millimeters, while in certain other embodiments, each first tubular conduit 753 has a hydraulic diameter of about 10 millimeters.

In certain embodiments, the outlet vent 750 comprises intermediate tubular conduits 756 generally parallel to one another and extending from the inlet portion 751 to the outlet portion 752 in the first direction. The intermediate tubular conduits 756 are between the periphery and the center such that the plurality of intermediate tubular conduits 756 generally surround the plurality of first tubular conduits 753 and are generally surrounded by the plurality of second tubular conduits 754. Each intermediate tubular conduit 756 has a length in the first direction, a width in the second direction, and a ratio of the length divided by the width. In certain embodiments, the ratios of the intermediate tubular conduits 756 are less than the ratios of the second tubular conduits 754 and are greater than the ratios of the first tubular conduits 753. In certain embodiments, the intermediate tubular conduits 756 have hydraulic diameters in a range between 4 millimeters and 12 millimeters, while in certain other embodiments, these intermediate tubular conduits 756 have hydraulic diameters of about 7 millimeters. The walls 755 between the tubular conduits 753, 754, 756 have thicknesses in a range between about 0.2 millimeter and about 4 millimeters, while in certain other embodiments, the walls 755 have thicknesses of about 1 millimeter. The intermediate tubular conduits 756 generally surround the first tubular conduits 753 (e.g., in rings around a central axis), and the second tubular conduits 754 generally surround the intermediate tubular conduits 756 (e.g., in rings around the central axis).

For example, for the outlet vent 750 of FIGS. 10A and 10B, each of the first and second tubular conduits 753, 754 has a length of about 40 millimeters and the walls between the tubular conduits 753, 754, 756 have thicknesses of about 1 millimeter. The central first tubular conduit 753 and the first surrounding ring of first tubular conduits 753 each have hydraulic diameters of about 10 millimeters, corresponding to a length-to-width ratio of about 4. The next two rings of intermediate tubular conduits 756 towards the periphery have hydraulic diameters of about 7 millimeters, corresponding to a length-to-width ratio of about 5 to 7. The two outer rings of second tubular conduits 754 have hydraulic diameters of about 4 millimeters, corresponding to a length-to-width ratio of about 10.

In certain embodiments, such a configuration of the first and second tubular conduits 753, 754 advantageously provides reduced mixing of the air flowing out of the appliance 701 and the surrounding air. Without being bound by theory, the air flowing out of the narrower second tubular conduits 754 can effectively shield the air flowing out of the first tubular conduits 753 in the center region of the outlet vent 750 from mixing with the surrounding air so that the temperature of the air from the center region is relatively unchanged while it propagates to the user (thereby providing a "tunnel" or "pipe" effect). In addition, in certain embodiments, there is less air flowing out of the second tubular conduits 754 at the periphery than out of the first tubular conduits 753 near the center, and since it is the air at the periphery that primarily mixes with ambient air, mixing of the conditioned air with the surrounding air is advantageously reduced.

FIG. 11A schematically illustrates an example outlet vent 750 compatible with certain embodiments described herein having a generally rectangular register. For example, the plurality of first tubular conduits 753 and the plurality of second tubular conduits 754 can be arranged in a generally rectangular pattern, as schematically illustrated by FIG. 11A. FIG. 11B schematically illustrates a cross-sectional view of the outlet vent 750 of FIG. 11A along the dashed line B-B and FIG. 11C schematically illustrates a cross-sectional view of the outlet vent 750 of FIG. 11A along the dashed line C-C. In certain embodiments, each second tubular conduit 754 has a generally rectangular cross-section perpendicular to the first direction, and each first tubular conduit 753 has a generally rectangular cross-section perpendicular to the first direction, as schematically illustrated by FIG. 1A.

As with the outlet vent 750 with the circular register schematically illustrated by FIGS. 10A and 10B, the outlet vent 750 of FIGS. 11A-11C has first tubular conduits 753 with hydraulic diameters of about 10 millimeters, intermediate tubular conduits 756 with hydraulic diameters of about 7 millimeters, and second tubular conduits 754 with hydraulic diameters of about 4 millimeters. The intermediate tubular conduits 756 generally surround the first tubular conduits 753 (e.g. in rings around a central axis), and the second tubular conduits 754 generally surround the intermediate tubular conduits 756 (e.g. in rings around the central axis).

In certain embodiments, a front face 757 of the outlet vent 750 is rounded, as shown in FIGS. 11B and 11C (e.g. for cosmetic purposes). The overall thickness of the outlet vent 750 of FIGS. 11A-11C is about 40 millimeters, and the rectangular front face 757 has dimensions of about 60 millimeters by about 90 millimeters, resulting in about the same total area as the circular register configuration of FIGS. 10A and 10B. In certain embodiments, the outlet vent 750 is mechanically coupled to the appliance 701 by pivots (e.g., on the ends and on the top and bottom) so its orientation can be adjusted to direct the air flow in a desired direction.

Certain embodiments described herein provide conditioning of the local environment of a user which is more localized than that provided by conventional fans or space heaters, which are localized but more region-oriented. For example, certain embodiments only impact the individual user. As a further example, certain embodiments only impact a portion of the individual user, and the fluid transfer from the appliance 701 can be used instead of conventional heating or cooling pads. In certain embodiments, the appliance 701 provides more efficient conditioning (e.g. twice as efficient per BTU delivered to the user) than do conventional systems. For example, certain embodiments described herein utilize about 1/15 to about 1/20 of a conventional space heater.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed:

1. A personal environment appliance comprising:
   at least one inlet port;
   at least one thermoelectric module comprising a main flow conduit and a waste flow conduit, the at least one thermoelectric module over the at least one inlet port;
   at least one main outlet port spaced from the at least one inlet port and in fluidic communication with the main flow conduit;
   at least one waste outlet port spaced from the at least one inlet port and in fluidic communication with the waste flow conduit;
   at least one filter between the at least one inlet port and the at least one thermoelectric module; and
   at least one fan configured to drive a first air flow from the at least one inlet port, through the at least one filter, through the main flow conduit, and through the at least one main outlet port, the at least one fan further configured to drive a second air flow from the at least one inlet port, through the waste flow conduit, and through the at least one waste outlet port, wherein the first air flow has a first volumetric flow rate that is less than a second volumetric flow rate of the second air flow.

2. The appliance of claim 1, wherein the at least one main outlet port is on a first side of the appliance and the at least one waste outlet port is on a second side of the appliance, the second side different from the first side.

3. The appliance of claim 2, wherein the the first air flow through the at least one main outlet port is generally towards a user of the appliance and the second air flow through the at least one waste outlet port is in a generally upward direction away from the user.

4. The appliance of claim 1, wherein the at least one fan is further configured to drive the second air flow from the at least one inlet port, through the at least one filter, through the waste flow conduit, and through the at least one waste outlet port.

5. The appliance of claim 1, wherein the at least one thermoelectric module is positioned so that condensation formed on the at least one thermoelectric module drips onto the at least one filter.

6. The appliance of claim 1, wherein the thermoelectric module comprises at least one thermoelectric element comprising a main side in thermal communication with the main flow conduit and comprising a waste side in thermal communication with the waste flow conduit.

7. The appliance of claim 6, wherein the main flow conduit comprises one or more main heat exchangers in thermal communication with the main side and the waste flow conduit comprises one or more waste heat exchangers in thermal communication with the waste side.

8. The appliance of claim 7, wherein the one or more main heat exchangers comprises a plurality of portions which are substantially thermally isolated from one another along a direction of the first air flow through the main flow conduit.

9. The appliance of claim 7, wherein the one or more waste heat exchangers comprises a plurality of portions which are substantially thermally isolated from one another along a direction of the second air flow through the waste flow conduit.

10. The appliance of claim 1, wherein the first air flow through the main flow conduit is substantially parallel to the second air flow through the waste flow conduit.

11. The appliance of claim 10, wherein the first air flow through the main flow conduit and the second air flow through the waste flow conduit are in the substantially same direction.

12. The appliance of claim 11, wherein the first air flow through the at least one main outlet port and the second air flow through the at least one waste outlet port are in different directions.

13. The appliance of claim 1, wherein the first air flow from the main flow conduit to the at least one main outlet port is substantially thermally isolated from the second air flow from the waste flow conduit to the at least one waste outlet port.

14. The appliance of claim 13, wherein the appliance comprises a substantially thermally insulating material between the first air flow and the second air flow.

15. The appliance of claim 1, further comprising a housing substantially enclosing the at least one thermoelectric module, the at least one filter, and the at least one fan, the housing comprising at least two separate elements which are configured to be coupled together to form the housing.

16. The appliance of claim 15, wherein the at least two separate elements, when coupled together to form the housing, provide a main flow path for the first air flow from the main flow conduit to the at least one main outlet port and a waste flow path for the second air flow from the waste flow conduit to the at least one waste outlet port, wherein the main flow path and the waste flow path are substantially thermally isolated from one another.

17. The appliance of claim 16, wherein the at least two separate elements comprise one or more recesses and one or more protrusions which mate together when the at least two separate elements are assembled together so as to provide a substantially airtight seal of the main flow path, the waste flow path, or both.

18. The appliance of claim 1, wherein the thermoelectric module comprises a main side and the main flow conduit comprises a main heat exchanger in thermal communication with the main side, the main heat exchanger comprising at least one thermally conductive sheet having a first plurality of folds and a second plurality of folds such that the sheet forms a plurality of fins.

19. The appliance of claim 18, wherein the first plurality of folds are in thermal communication with the main side.

20. The appliance of claim 19, wherein the second plurality of folds are coupled to a thermally insulative sheet generally parallel to the main side, the thermally insulative sheet at least partially bounding the main flow conduit.

21. The appliance of claim 1, wherein the thermoelectric module comprises a waste side and the waste flow conduit comprises a waste heat exchanger in thermal communication with the waste side, the waste heat exchanger comprising at least one thermally conductive sheet having a first plurality of folds and a second plurality of folds such that the sheet forms a plurality of fins.

22. The appliance of claim 21, wherein the first plurality of folds are in thermal communication with the waste side.

23. The appliance of claim 22, wherein the second plurality of folds are coupled to a thermally insulative sheet generally parallel to the waste side, the thermally insulative sheet at least partially bounding the waste flow conduit.

24. The appliance of claim 1, wherein the first air flow comprises a volumetric flow rate of 5 to 10 cubic feet per minute.

25. The appliance of claim 1, wherein the second air flow comprises a volumetric flow rate 1.5 to 3 times the volumetric flow rate of the first air flow.

26. A method of adjusting the personal environment of a user, the method comprising:
providing an appliance comprising:
at least one inlet port;
at least one thermoelectric module comprising a main flow conduit and a waste flow conduit, the at least one thermoelectric module over the at least one inlet port;
at least one main outlet port spaced from the at least one inlet port and in fluidic communication with the main flow conduit;
at least one waste outlet port spaced from the at least one inlet port and in fluidic communication with the waste flow conduit; and
at least one filter between the at least one inlet port and the at least one thermoelectric module; and
driving a first air flow from the at least one inlet port, through the at least one filter, through the main flow conduit, and through the at least one main outlet port, wherein the first air flow through the main flow conduit is cooled or heated according to control settings selected by a user; and
driving a second air flow from the at least one inlet port, through the waste flow conduit, and through the at least one waste outlet port.

27. The method of claim 26, further comprising directing the first air flow through the at least one main outlet port generally towards a user of the appliance and directing the second air flow through the at least one waste outlet port generally upward away from the user.

28. The method of claim 26, wherein driving the second air flow comprising driving the second air flow from the at least one inlet port, through the at least one filter, through the waste flow conduit, and through the at least one waste outlet port.

29. The method of claim 26, further comprising allowing condensation formed on the at least one thermoelectric module to drip onto the at least one filter and allowing the condensation to evaporate from the at least one filter.

30. The method of claim 26, wherein the control settings selected by the user allow a user to determine the amount of temperature change according to a plurality of discrete levels or continuous adjustment.

* * * * *

UNITED STATES PATENT AND TRADEMARK OFFICE
CERTIFICATE OF CORRECTION

| | |
|---|---|
| PATENT NO. | : 8,490,412 B2 |
| APPLICATION NO. | : 12/135062 |
| DATED | : July 23, 2013 |
| INVENTOR(S) | : Bell et al. |

It is certified that error appears in the above-identified patent and that said Letters Patent is hereby corrected as shown below:

Title Page (Abstract, item 57) at line 11, Change "width," to --width.--.

In the Specification

In column 4 at line 49, Change "thermoionic" to --thermionic--.

In column 4 at line 52, Change "thermoionic" to --thermionic--.

In column 5 at line 28, Change "though" to --through--.

In column 12 at line 64, Change "upwared" to --upward--.

In column 17 at line 7, Change "1A." to --11A.--.

In the Claims

In column 18 at line 11, In Claim 3, change "wherein the the" to --wherein the--.

Signed and Sealed this
Eighteenth Day of February, 2014

Michelle K. Lee
*Deputy Director of the United States Patent and Trademark Office*